(12) United States Patent
Shinotsuka et al.

(10) Patent No.: US 10,581,005 B2
(45) Date of Patent: Mar. 3, 2020

(54) ORGANIC THIN-FILM SOLAR CELL AND ORGANIC THIN-FILM SOLAR CELL MANUFACTURING METHOD

(71) Applicant: Oji Holdings Corporation, Tokyo (JP)

(72) Inventors: Kei Shinotsuka, Kawasaki (JP);
Takayuki Okamoto, Wako (JP)

(73) Assignee: Oji Holdings Corporation, Tokyo (JP)

(*) Notice: Subject to any disclaimer, the term of this patent is extended or adjusted under 35 U.S.C. 154(b) by 176 days.

(21) Appl. No.: 14/900,999

(22) PCT Filed: Jun. 27, 2014

(86) PCT No.: PCT/JP2014/067111
§ 371 (c)(1),
(2) Date: Dec. 22, 2015

(87) PCT Pub. No.: WO2014/208713
PCT Pub. Date: Dec. 31, 2014

(65) Prior Publication Data
US 2016/0149149 A1     May 26, 2016

(30) Foreign Application Priority Data
Jun. 27, 2013 (JP) .................. 2013-135382

(51) Int. Cl.
*H01L 51/44*     (2006.01)
*H01L 51/00*     (2006.01)
*H01L 51/52*     (2006.01)

(52) U.S. Cl.
CPC ........ *H01L 51/447* (2013.01); *H01L 51/0017* (2013.01); *H01L 51/5268* (2013.01);
(Continued)

(58) Field of Classification Search
CPC .................. H01L 51/447; H01L 51/0017
See application file for complete search history.

(56) References Cited

U.S. PATENT DOCUMENTS

2011/0308612 A1  12/2011  Shiozawa et al.
2012/0097229 A1  4/2012   Aoki
(Continued)

FOREIGN PATENT DOCUMENTS

CN   102472847 A   5/2012
CN   102652366 A   8/2012
(Continued)

OTHER PUBLICATIONS

Office Action in Chinese Application No. 201480036760.6, dated Mar. 2, 2017.
(Continued)

*Primary Examiner* — Shannon M Gardner
(74) *Attorney, Agent, or Firm* — Knobbe, Martens, Olson & Bear, LLP

(57) ABSTRACT

Provided is an organic thin-film solar cell, including: a substrate, an anode, an organic thin-film layer that includes an organic semiconductor layer, and a cathode. The anode, the organic thin-film layer that includes the organic semiconductor layer, and the cathode are layered in order on top of the substrate. A recess and protrusion-shaped microstructure that includes a plurality of recesses or protrusions arranged two-dimensionally at random is formed in an interface between the organic thin-film layer and the cathode. The recess and protrusion-shaped microstructure is formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and when the real part $k_1$ corresponds to an upper wavenumber limit $K_1$ in a power spectrum of a height
(Continued)

distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer, the power spectrum of the height distribution of the microstructure exhibits determinate values between the upper wavenumber limit $K_1$ and the lower wavenumber limit $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution across all wavenumbers.

5 Claims, 7 Drawing Sheets

(52) U.S. Cl.
CPC ....... *H01L 2251/105* (2013.01); *Y02E 10/549* (2013.01); *Y02P 70/521* (2015.11)

(56) References Cited

U.S. PATENT DOCUMENTS

2013/0186462 A1 7/2013 Takezoe et al.
2014/0167017 A1* 6/2014 Shinotsuka ......... H01L 51/5268
257/40

FOREIGN PATENT DOCUMENTS

| | | |
|---|---|---|
| CN | 102782868 A | 11/2012 |
| EP | 2728967 A1 | 5/2014 |
| JP | 2002-111017 A | 4/2002 |
| JP | 2009-158478 A | 7/2009 |
| JP | 2011-014937 A | 1/2011 |
| JP | A-2011-108722 | 6/2011 |
| JP | 2011-187573 A | 9/2011 |
| JP | 2012-004497 A | 1/2012 |
| JP | 2013-084895 A | 5/2013 |
| TW | 201310746 A1 | 3/2013 |
| WO | WO 2013/005638 A1 | 1/2013 |
| WO | WO-2013005638 A1 * | 1/2013 ......... H01L 51/5268 |
| WO | WO 2013/083712 A1 | 6/2013 |
| WO | WO 2013/083713 A1 | 6/2013 |

OTHER PUBLICATIONS

Search Report in European Patent Application No. 14816636.6, dated Feb. 23, 2017.
International Search Report dated Aug. 5, 2014 in international application No. PCT/JP2014/067111.
Taiwanese Office Action dated Nov. 9, 2017 for Application No. TW103122393 in 15 pages including translation.

* cited by examiner

SOLAR CELL EQUIVALENT CIRCUIT

CURRENT-VOLTAGE CHARACTERISTICS OF SOLAR CELL

ORGANIC THIN-FILM SOLAR CELL AND ORGANIC THIN-FILM SOLAR CELL MANUFACTURING METHOD

CROSS-REFERENCE TO RELATED APPLICATIONS

This application is the U.S. National Phase under 35. U.S.C. § 371 of International Application PCT/JP2014/067111, filed Jun. 27, 2014, which claims priority to Japanese Patent Application No. 2013-135382, filed Jun. 27, 2013. The disclosures of the above-described applications are hereby incorporated by reference in their entirety.

TECHNICAL FIELD

The present invention relates to an organic thin-film solar cell and a method of manufacturing an organic thin-film solar cell, and more particularly to an organic thin-film solar cell with improved photovoltaic energy conversion efficiency and a method of manufacturing such an organic thin-film solar cell.

BACKGROUND ART

Organic thin-film solar cells are a well-known type of solar cell and are made using an organic semiconductor.

Organic thin-film solar cells are thinner, lighter, and more flexible than conventional solar cells. Furthermore, organic thin-film solar cells are easier and cheaper to manufacture than inorganic solar cells made from monocrystalline materials or thin-films of silicon or compounds such as GaAs, CIS, or CIGS.

Moreover, manufacturing methods for organic thin-film solar cells are simple because no electrolyte solutions are used during manufacture and the structure of the cells is simpler than in dye-sensitized solar cells (another type of organic solar cell). Organic thin-film solar cells also exhibit advantages in terms of flexibility and lifespan.

In addition, when manufactured using the roll-to-roll method with a high speed rotary printing press, organic thin-film solar cells can be produced at roughly 1/10 the cost of conventional vacuum deposition methods and are believed to be the lowest-cost solar cells that can generate power.

However, in comparison with silicon-type or compound-type inorganic solar cells, organic thin-film solar cells tend to exhibit a lower photovoltaic energy conversion efficiency per unit area because the organic semiconductor materials used therein tend to have a low photovoltaic energy conversion efficiency.

More specifically, in a conventional organic thin-film solar cell, when the cell is irradiated with sunlight, that light first has to pass through components such as the anode (which is a transparent electrode) before reaching an organic semiconductor layer. The light that passes through the organic semiconductor layer reaches a cathode which is made from a metal, reflects off of the metal cathode, and passes through the organic semiconductor layer again before escaping out of the cell.

This light that passes through the organic semiconductor layer is converted to photovoltaic energy. However, the photovoltaic energy conversion efficiency of organic semiconductor materials is less than that of inorganic semiconductor materials such as silicon that are already used widely, and as a result, the photovoltaic energy conversion efficiency of the overall organic thin-film solar cell is less than that of an inorganic solar cell.

Despite having many advantages as described above, organic thin-film solar cells tend to exhibit a low photovoltaic energy conversion efficiency. Therefore, there is high demand for development of organic thin-film solar cells that have a higher photovoltaic energy conversion efficiency and still allow all of the abovementioned advantages to be utilized.

It should also be noted that as of the time of this filing, the only prior art known to the present applicant are those technologies described above. Technologies analogous to the present invention have not previously been disclosed, and therefore there are no prior art documents that should be cited here.

SUMMARY OF INVENTION

Technical Problem

The present invention was made in view of the various abovementioned problems with conventional technologies and aims to provide an organic thin-film solar cell with improved photovoltaic energy conversion efficiency and a method of manufacturing such an organic thin-film solar cell.

Solution to Problem

In order to achieve the abovementioned object, the present invention provides an organic thin-film solar cell in which a recess and protrusion-shaped microstructure is formed in an interface between an organic semiconductor layer and a cathode.

In other words, the organic thin-film solar cell of the present invention includes a substrate and at least an anode, an organic semiconductor layer, and a cathode layered on top of the substrate, a recess and protrusion-shaped microstructure that includes a plurality of recesses or protrusions arranged two-dimensionally at random being formed in an interface between the organic semiconductor layer and the cathode, and the recess and protrusion-shaped microstructure being formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along the interface between the organic semiconductor layer and the cathode, a power spectrum of a height distribution of the microstructure on the interface exhibits determinate values between a wavenumber $K_1=k_1$ and a wavenumber $K_2=k_2$, and an integrated value of a spectral intensity over this wavenumber range is equal to at least 50% of an integrated value of the spectral intensity over all wavenumbers.

Furthermore, the organic thin-film solar cell of the present invention includes a substrate and at least an anode, an organic semiconductor layer, and a cathode layered on top of the substrate, a recess and protrusion-shaped microstructure that includes a plurality of recesses or protrusions arranged two-dimensionally at random being formed in a surface of the substrate, the recess and protrusion shape being duplicated in interfaces between the anode, the organic semiconductor layer, and the cathode, and the recess and protrusion-shaped microstructure being formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along the interface between the organic semiconductor layer and the cathode, a power spectrum of a height distribution of the microstructure on the interface exhibits determinate values between a wavenumber $K_1=k_1$ and a wavenumber $K_2=k_2$, and an integrated value of a spectral intensity over this wavenumber range is equal to at least 50% of an integrated value of the spectral intensity over all wavenumbers.

Moreover, in the organic thin-film solar cell of the present invention, the depth of the recesses and the height of the protrusions is from 15 to 180 nm.

Furthermore, a method of manufacturing an organic thin-film solar cell of the present invention is a method of manufacturing an organic thin-film solar cell that includes a substrate and at least an anode, an organic semiconductor layer, and a cathode layered on top of the substrate, the method including the steps of: forming a particle film that includes a mixture of particles of different average particle sizes on a surface of the substrate; dry etching using the particle film as an etching mask in order to form a recess and protrusion-shaped microstructure that includes a plurality of recesses or protrusions arranged two-dimensionally at random on the surface of the substrate; and layering at least the anode, the organic semiconductor layer, and the cathode on top of the substrate such that the shape of the microstructure is duplicated in interfaces between the anode, the organic semiconductor layer, and the cathode.

Furthermore, a method of manufacturing an organic thin-film solar cell of the present invention is a method of manufacturing an organic thin-film solar cell that includes a substrate and at least an anode, an organic semiconductor layer, and a cathode layered on top of the substrate, the method including the steps of: forming a particle film that includes a mixture of particles of different average particle sizes on a surface of an original plate; dry etching using the particle film as an etching mask in order to form a recess and protrusion-shaped microstructure that includes a plurality of recesses or protrusions arranged two-dimensionally at random on the surface of the original plate; transferring the microstructure formed in the surface of the original plate to at least one surface of the substrate; and layering at least the anode, the organic semiconductor layer, and the cathode on top of the substrate such that the shape of the microstructure transferred onto the substrate is duplicated in interfaces between the anode, the organic semiconductor layer, and the cathode.

Furthermore, a method of manufacturing an organic thin-film solar cell of the present invention is a method of manufacturing an organic thin-film solar cell that includes a substrate and at least an anode, an organic semiconductor layer, and a cathode layered on top of the substrate, the method including the steps of: forming a particle film that includes a mixture of particles of different average particle sizes on a surface of an original plate; dry etching using the particle film as an etching mask to form a recess and protrusion-shaped microstructure that includes a plurality of recesses or protrusions arranged two-dimensionally at random on the surface of the original plate in order to produce an original plate; layering at least the anode and the organic semiconductor layer on top of the substrate; transferring the microstructure formed in the surface of the original plate or an inverted microstructure formed in a surface of an inverted original plate to a surface of the organic semiconductor layer; and layering the cathode on top of the organic semiconductor layer such that the microstructure or the inverted microstructure is formed in an interface between the organic semiconductor layer and the cathode.

Moreover, in the method of manufacturing an organic thin-film solar cell of the present invention, the recess and protrusion-shaped microstructure is formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along the interface between the organic semiconductor layer and the cathode, a power spectrum of a height distribution of the microstructure on the interface exhibits determinate values between a wavenumber $K_1=k_1$ and a wavenumber $K_2=k_2$, and an integrated value of a spectral intensity over this wavenumber range is equal to at least 50% of an integrated value of the spectral intensity over all wavenumbers.

In other words, the present invention relates to the following.

(1) An organic thin-film solar cell, including:

an organic thin-film solar cell substrate;

an anode;

an organic thin-film layer that includes an organic semiconductor layer; and a cathode, the anode, the organic thin-film layer that includes the organic semiconductor layer, and the cathode being layered in order on top of the substrate, a recess and protrusion-shaped microstructure that includes a plurality of recesses or protrusions arranged two-dimensionally at random being formed in an interface between the organic thin-film layer and the cathode, and the recess and protrusion-shaped microstructure being formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer, the power spectrum of the height distribution of the microstructure exhibits determinate values between the upper wavenumber limit $K_1$ and the lower wavenumber limit $K_2$, and an integrated value of a spectral intensity of the power spectrum of the height distribution in a wavenumber range from $K_1$ to $K_2$ is equal to at least 50% of an integrated value of the spectral intensity of the power spectrum of the height distribution over all wavenumbers.

(2) An organic thin-film solar cell, including:
an organic thin-film solar cell substrate;
an anode;
an organic thin-film layer that includes an organic semiconductor layer; and
a cathode,
the anode, the organic thin-film layer that includes the organic semiconductor layer, and the cathode being layered in order on top of the substrate,
a recess and protrusion-shaped microstructure that includes a plurality of recesses or protrusions arranged two-dimensionally at random being formed in a surface of the substrate,
the recess and protrusion-shaped microstructure being duplicated at interfaces between the anode, the organic thin-film layer, and the cathode, and
the recess and protrusion-shaped microstructure being formed such that,
when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and
when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer,
the power spectrum of the height distribution of the microstructure exhibits determinate values between the upper wavenumber limit $K_1$ and the lower wavenumber limit $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution over all wavenumbers.

(3) The organic thin-film solar cell according to (1) or (2), wherein an average depth of the recesses or an average height of the protrusions of the microstructure is from 15 to 180 nm.

(4) A method of manufacturing an organic thin-film solar cell that includes an organic thin-film solar cell substrate and an anode, an organic thin-film layer including an organic semiconductor layer, and a cathode layered in order on top of the substrate, the method including:
forming a particle monolayer film that includes a mixture of particles of different average particle sizes on a surface of the substrate;
dry etching using the particle monolayer film as an etching mask to form a microstructure that includes a plurality of recesses or protrusions arranged two-dimensionally at random on the surface of the substrate; and
layering at least the anode, the organic thin-film layer, and the cathode on top of the substrate such that a shape of the microstructure formed in the dry etching step is duplicated in interfaces between the anode, the organic thin-film layer, and the cathode.

(5) A method of manufacturing an organic thin-film solar cell that includes an organic thin-film solar cell substrate and an anode, an organic thin-film layer including an organic semiconductor layer, and a cathode layered in order on top of the substrate, the method including:
forming a particle monolayer film that includes a mixture of particles of different average particle sizes on a surface of an original plate for a mold;
dry etching using the particle monolayer film as an etching mask to form a microstructure that includes a plurality of recesses or protrusions arranged two-dimensionally at random on the surface of the original plate for the mold;
transferring the microstructure formed in the surface of the original plate for the mold to at least one surface of the organic thin-film solar cell substrate; and
layering at least the anode, the organic thin-film layer, and the cathode on top of the organic thin-film solar cell substrate such that a shape of the microstructure is duplicated in interfaces between the anode, the organic thin-film layer, and the cathode.

(6) A method of manufacturing an organic thin-film solar cell that includes an organic thin-film solar cell substrate and an anode, an organic thin-film layer including an organic semiconductor layer, and a cathode layered in order on top of the substrate, the method including:
forming a particle monolayer film that includes a mixture of particles of different average particle sizes on a surface of an original plate;
dry etching using the particle monolayer film as an etching mask to form a recess and protrusion-shaped microstructure that includes a plurality of recesses or protrusions arranged two-dimensionally at random on the surface of the original plate in order to produce an original plate for a mold, and producing, as needed, an original plate for an inverted mold which is a transfer member in which the recess and protrusion-shaped microstructure is inverted;
layering at least the anode and the organic thin-film layer on top of the organic thin-film solar cell substrate;
transferring the microstructure to a surface of any one of the layers of the organic thin-film layer by pressing the original plate for the mold or the original plate for the inverted mold thereon; and
forming, as a film, an additional organic thin-film layer on a cathode side of a microstructure transfer surface of the organic thin-film layer if such an additional organic thin-film layer should be present and then layering the cathode on top of that additional organic thin-film layer in order to form the microstructure or the inverted microstructure in an interface between the organic thin-film layer and the cathode.

(7) The method of manufacturing an organic thin-film solar cell according to (4), (5) or (6),
wherein the microstructure is formed such that,
when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and
when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer, the power spectrum of the height distribution of the microstructure exhibits determinate values between the wavenumber $K_1$ and the wavenumber $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution over all wavenumbers.

Advantageous Effects of Invention

The present invention, configured as described above, exhibits an advantageous effect by making it possible to improve the photovoltaic energy conversion efficiency of an organic thin-film solar cell.

BRIEF DESCRIPTION OF DRAWINGS

FIG. 3A (a-1) illustrates a particle monolayer film in which the average particle diameter is fixed at a particle diameter D. FIG. 3A (a-2) shows a power spectrum of a height distribution of the front surface of an organic thin-film solar cell substrate that has a two-dimensional lattice structure with a fixed-period microstructure. FIG. 3A (a-3) shows a profile of the power spectrum of the height distribution of the two-dimensional lattice structure with the fixed-period microstructure.

FIG. 3B (b-1) illustrates a particle monolayer film according to the embodiment of the present invention. FIG. 3B (b-2) shows a power spectrum of a height distribution of the front surface of a transparent substrate of the organic thin-film solar cell (which has a microstructure) according to the embodiment of the present invention. FIG. 3B (b-3) shows a profile of the power spectrum of the height distribution of the front surface of the substrate of the organic thin-film solar cell according to the embodiment of the present invention.

DESCRIPTION OF EMBODIMENTS

An example of an embodiment of the organic thin-film solar cell and the method of manufacturing an organic thin-film solar cell according to the present invention will be described in detail below with reference to the attached drawings.

<Configuration of Organic Thin-Film Solar Cell>

Figure 1:
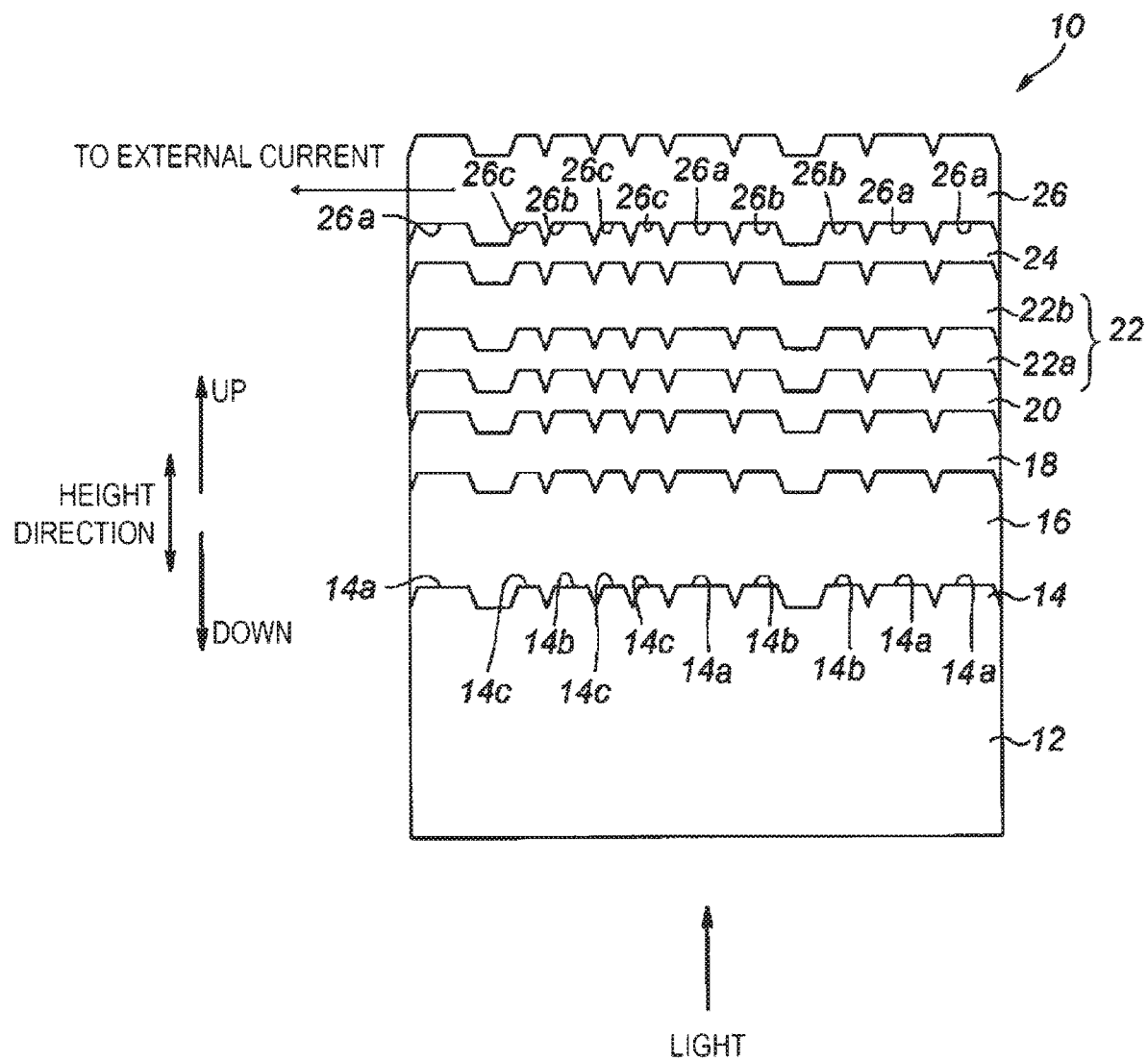
FIG. 1 is a cross-sectional view schematically illustrating a configuration of an organic thin-film solar cell according to an embodiment of the present invention.

FIG. 1 is a cross-sectional view schematically illustrating a configuration of a bottom surface-light receiving organic thin-film solar cell according to an embodiment of the present invention.

Note that for convenience, in the following description of the organic thin-film solar cell 10 according to the embodiment of the present invention as illustrated in FIG. 1, the upper surfaces of the layers of the organic thin-film solar cell 10 in the height direction thereof will be referred to as "front surfaces", and the lower surfaces in the height direction will be referred to as "rear surfaces".

The organic thin-film solar cell 10 illustrated in FIG. 1 includes, layered in order, a substrate 12 (that is, an organic thin-film solar cell substrate), a microstructure 14 formed on the front surface of the substrate 12, an anode 16 formed on top of the microstructure 14, a hole extraction layer 18 formed on top of the anode 16, an electron blocking layer 20 formed on top of the hole extraction layer 18, an electron-donating organic semiconductor layer 22a (below, referred to simply as the "electron-donating layer 22a") formed on top of the electron blocking layer 20, an electron-accepting organic semiconductor layer 22b (below, referred to simply as the "electron-accepting layer 22b") formed on top of the electron-donating layer 22a, an electron extraction layer 24 formed on top of the electron-accepting layer 22b, and a cathode 26 formed on top of the electron extraction layer 24.

In other words, the organic thin-film solar cell according to one aspect of the embodiment of the present invention includes an organic thin-film solar cell substrate and an anode, a hole extraction layer, an electron blocking layer, an electron-donating organic semiconductor layer, an electron-accepting organic semiconductor layer, an electron extraction layer, and a cathode layered in that order on top of the substrate, an interface between the electron extraction layer and the cathode having formed thereon a recess and protrusion-shaped microstructure in which a plurality of protrusions or recesses are arranged two-dimensionally at random, and the recess and protrusion-shaped microstructure being configured to satisfy below mentioned microstructure requirements.

In the present specification and claims, "organic semiconductor layer" refers to a layer that includes the electron-donating layer 22a and the electron-accepting layer 22b.

Moreover, in the present specification and claims, "organic thin-film layer that includes the organic semiconductor layer" refers to a stacked body that includes at least the organic semiconductor layer (that is, the electron-donating layer 22a and the electron-accepting layer 22b).

In other words, one aspect of the "organic thin-film layer that includes the organic semiconductor layer" is a layer that includes the electron-donating layer 22a and the electron-accepting layer 22b.

Another aspect of the "organic thin-film layer that includes the organic semiconductor layer" is a stacked body that includes the electron-donating layer 22a and the electron-accepting layer 22b as well as at least one layer selected from a group consisting of the hole extraction layer 18, the electron blocking layer 20 and the electron extraction layer 24.

In the present embodiment, the material used for the substrate 12 is not particularly limited as long as that material transmits sunlight. This material may be an inorganic material, an organic material, or a combination thereof. It is preferable that the base material 12 be a transparent base material.

Here, "transparent" refers to a transmittance of at least 70% to directly incident light.

Examples of inorganic materials for the substrate 12 include glasses such as fused quartz, alkali-free glasses, and white glasses as well as transparent inorganic minerals such as mica.

Examples of organic materials for the substrate 12 include resin films such as cycloolefin films and polyester films, fiber-reinforced plastics in which resin films such as the above are impregnated with microfibers such as cellulose nanofibers, and materials in which a barrier layer made from a compound such as $SiO_2$, SiC, SiN, or SiON is formed on the surface of one of the abovementioned organic material films.

Furthermore, on the front surface of the substrate 12 (the side on which the anode 16 is layered), a plurality of protrusions 14a, 14b, and 14c of different diameters are arranged, thereby forming a recess and protrusion-shaped microstructure 14 in which a plurality of recesses and protrusions are arranged two-dimensionally at random. The recess and protrusion shape of this microstructure 14 will be described in more detail later.

In the present embodiment, the anode 16 is made from a transparent, conductive material that transmits sunlight. This transparent and conductive material is not particularly limited. Any well-known transparent and conductive material may be used.

Examples of transparent and conductive materials include indium tin oxide (ITO), indium zinc oxide (IZO), zinc oxide (ZnO), and zinc tin oxide (ZTO).

In the present embodiment, it is preferable that indium tin oxide (ITO) be used as the transparent and conductive material for the anode 16.

In the present embodiment, it is preferable that the thickness of the anode 16 made from ITO be from 50 to 200 nm and more preferable that the thickness be from 70 to 170 nm.

Here, "thickness of the anode 16" refers to the shortest distance from a point on the front surface of the anode 16 to the rear surface of the anode 16. This distance can be obtained by selecting 20 random points on the front surface of the anode 16, measuring the shortest distance from each point to the rear surface of the anode 16, and then averaging the measured values, for example.

An organic material is typically used for the hole extraction layer 18 and the electron blocking layer 20.

Examples of materials for the hole extraction layer 18 include 1,4,5,8,9,12-hexaazatriphenylene hexacarbonitrile (below, simply "HAT-CN"), molybdenum oxides (MoOx), and 4,4',4''-tris(N,N-2-naphthylphenylamino)triphenylamine (below, simply "2-TNATA"). Of these, it is preferable that 1,4,5,8,9,12-hexaazatriphenylene hexacarbonitrile (HAT-CN) be used.

It is preferable that the thickness of the hole extraction layer 18 made from HAT-CN be from 5 to 100 nm and more preferable that the thickness be from 10 to 50 nm.

Here, "thickness of the hole extraction layer 18" refers to the shortest distance from a point on the front surface of the hole extraction layer 18 to the rear surface of the hole extraction layer 18. This distance can be obtained by selecting 20 random points on the front surface of the hole extraction layer 18, measuring the shortest distance from each point to the rear surface of the hole extraction layer 18, and then averaging the measured values, for example.

Examples of materials for the electron blocking layer 20 include aromatic amine compounds such as tris[4-(5-phenylthiophene-2-yl)phenyl]amine (below, simply "TPTPA"), 4,4'-bis[(N-1-naphthyl-N-phenyl)-amino]-biphenyl (below, simply "α-NPD"), copper phthalocyanine (below, simply "CuPc"), and N,N'-Diphenyl-N,N'-di(m-tolyl)benzidine (below, simply "TPD"). Of these, it is preferable that tris[4-(5-phenylthiophene-2-yl)phenyl]amine (TPTPA) be used.

It is preferable that the thickness of the electron blocking layer 20 made from TPTPA be from 1 to 100 nm and more preferable that the thickness be from 5 to 20 nm.

Here, "thickness of the electron blocking layer 20" refers to the shortest distance from a point on the front surface of the electron blocking layer 20 to the rear surface of the electron blocking layer 20. This distance can be obtained by selecting 20 random points on the front surface of the electron blocking layer 20, measuring the shortest distance from each point to the rear surface of the electron blocking layer 20, and then averaging the measured values, for example.

Next, the organic semiconductor layer 22 that includes the electron-donating layer 22a and the electron-accepting layer 22b will be described.

Examples of materials for the electron-donating layer 22a include perylene derivatives and periflanthene derivatives. Of these, it is preferable that dibenzotetraphenylperiflanthene (below, simply "DBP") be used.

It is preferable that the thickness of the electron-donating layer 22a made from DBP be from 1 to 100 nm and more preferable that the thickness be from 5 to 15 nm.

Here, "thickness of the electron-donating layer 22a" refers to the shortest distance from a point on the front surface of the electron-donating layer 22a to the rear surface of the electron-donating layer 22a. This distance can be obtained by selecting 20 random points on the front surface of the electron-donating layer 22a, measuring the shortest distance from each point to the rear surface of the electron-donating layer 22a, and then averaging the measured values, for example.

Examples of materials for the electron-accepting layer 22b include fullerene-containing polymer compounds, and it is preferable that fullerene 60 (C60) be used.

It is preferable that the thickness of the electron-accepting layer 22b made from C60 be from 5 to 150 nm and more preferable that the thickness be from 20 to 80 nm.

Here, "thickness of the electron-accepting layer 22b" refers to the shortest distance from a point on the front surface of the electron-accepting layer 22b to the rear surface of the electron-accepting layer 22b. This distance can be obtained by selecting 20 random points on the front surface of the electron-accepting layer 22b, measuring the shortest distance from each point to the rear surface of the electron-accepting layer 22b, and then averaging the measured values, for example.

Examples of materials for the electron extraction layer 24 (electron extraction materials) include general-purpose organic materials and metal complex compounds such as oxadiazole compounds such as 2,9-Dimethyl-4,7-diphenyl-1,10-phenanthroline (below, simply "BCP"), tris(8-hydroxyquinolinato)aluminium (below, simply "Alq"), 2,5-Bis (1-naphthyl)-1,3,4-oxadiazole (below, simply "BND"), and 2-(4-tert-Butylphenyl)-5-(4-biphenylyl)-1,3,4-oxadiazole (below, simply "PBD"). Of these, it is preferable that 2,9-Dimethyl-4,7-diphenyl-1,10-phenanthroline (BCP) be used.

It is preferable that the thickness of the electron extraction layer 24 made from BCP be from 0.5 to 50 nm and more preferable that the thickness be from 1 to 20 nm.

Here, "thickness of the electron extraction layer 24" refers to the shortest distance from a point on the front surface of the electron extraction layer 24 to the rear surface of the electron extraction layer 24. This distance can be obtained by selecting 20 random points on the front surface of the electron extraction layer 24, measuring the shortest distance from each point to the rear surface of the electron extraction layer 24, and then averaging the measured values, for example.

The cathode 26 is a layer made from a metal. Examples of metals that can be used include aluminum, silver, and gold. However, it is preferable that aluminum be used in order to support a wide range of wavelengths of light.

It is preferable that the thickness of the cathode 26 made from aluminum be from 30 to 1000 nm and more preferable that the thickness be 100 nm.

Here, "thickness of the cathode 26" refers to the shortest distance from a point on the front surface of the cathode 26 to the rear surface of the cathode 26. This distance can be obtained by selecting 20 random points on the front surface of the cathode 26, measuring the shortest distance from each point to the rear surface of the cathode 26, and then averaging the measured values, for example.

The organic thin-film solar cell 10 according to the embodiment of the present invention includes the electron blocking layer 20. However, basic configurations of organic thin-film solar cells do not necessarily need to include such an electron blocking layer 20. In other words, to achieve charge separation near the p-n junction at the interface between the p-layer (the electron-donating layer) and the n-layer (the electron-accepting layer) of the organic semiconductor layer, a separate electron blocking layer does not have to be provided if a hole extraction material that does not allow electrons to penetrate therethrough is used for the hole extraction layer 18 in order to stop any electrons that arrive thereat.

In the organic thin-film solar cell 10 according to the embodiment of the present invention, it is preferable that the electron blocking layer 20 be formed in order to make it possible to easily verify hole extraction after charge separation during the actual production of the device.

<Shape and Effects of Microstructure>

Next, the shape of the microstructure 14 of the organic thin-film solar cell according to the embodiment of the present invention will be described in detail.

In the organic thin-film solar cell 10 of the present invention, the microstructure 14 includes a plurality of protrusions arranged two-dimensionally and is formed on top of the substrate 12. Therefore, a recess and protrusion-shaped structure formed by a plurality of protrusions similar to those in the microstructure 14 on the front surface of the substrate 12 is formed on the front surfaces of the anode 16, the hole extraction layer 18, the electron blocking layer 20, the organic semiconductor layer 22, the electron extraction layer 24, and the cathode 26 that are layered on top of the substrate 12 (that is, on the surfaces opposite to the side on which the substrate 12 is positioned). This is because each layer is extremely thin (at several dozen nm to approximately 100 nm), and therefore these layers do not fill the recess and protrusion structure formed on the front surface of the substrate 12 when layered thereon. As a result, the recess and protrusion structure formed on the front surface of the substrate 12 is duplicated at the interfaces between each of the layers.

Furthermore, on the rear surface of each of the layers of the organic thin-film solar cell 10 (that is, on the surfaces on the same side on which the substrate 12 is positioned), a recess and protrusion-shaped structure inverted relative to the microstructure 14 formed on the front surface of the substrate 12 is formed by a plurality of recesses arranged two-dimensionally.

In other words, in the organic thin-film solar cell 10 of the present invention, forming the microstructure 14 at the interface between the substrate 12 and the anode 16 makes it possible to achieve that same shape at the interface between the electron extraction layer 24 and the cathode 26, thereby making it possible for surface plasmons to occur at the cathode 26.

Next, the effect achieved by forming the recess and protrusion shape at the interface between the electron extraction layer 24 and the cathode 26 of the organic thin-film solar cell 10 according to the embodiment of the present invention (or at the interface between the organic thin-film layer and the cathode of the present invention) will be described.

As described above, in a conventional organic thin-film solar cell, incident sunlight passes through components such as the anode and then arrives at an organic semiconductor layer. In this organic semiconductor layer, a p-n junction is basically formed at the interface between the electron-donating layer (below, simply the "p-layer") and the electron-accepting layer (below, simply the "n-layer"). An i-layer (an intrinsic semiconductor layer) may be formed between the p-layer and the n-layer.

Here, "intrinsic semiconductor layer" refers to a pure semiconductor to which no additives have been added.

Applying light energy to the p-n junction of the organic semiconductor layer causes charge separation—that is, the electrons that escape from the electron-donating molecules are captured by the electron-accepting molecules. As a result, a difference in electric potential (an electromotive force) is generated between the cathode and the anode. Some of the incident light passes through the organic semiconductor layer, arrives at the cathode, reflects off of the cathode, and passes through the organic semiconductor layer again (further contributing to charge separation at the p-n junction) before finally escaping from the organic thin-film solar cell device.

One of the problems with conventional organic thin-film solar cells is that the organic semiconductor layer can only be formed with a film thickness of several dozen nm due to the characteristics thereof. As a result, the current obtained by the process described above as the light travels back and forth through the organic semiconductor layer is insufficient.

Meanwhile, in the organic thin-film solar cell 10 according to the embodiment of the present invention, forming the microstructure 14 on the front surface of the substrate 12 results in that microstructure 14 being duplicated between the electron extraction layer 24 and the cathode 26 as well, thereby forming a recess and protrusion-shaped recess and protrusion structure at the interface between the electron extraction layer 24 and the cathode 26.

Furthermore, forming the recess and protrusion shape of the microstructure 14 to satisfy certain requirements causes some of the light incident on the organic thin-film solar cell 10 (below, simply "transmitted light") to be diffracted by the recess and protrusion structure at the interface between the electron extraction layer 24 and the cathode 26, thereby exciting surface plasmons.

It should be noted that in the present specification and claims, this light is not particularly limited to light from a specific type of light source. The light may be sunlight or indoor light such as fluorescent light or LED light.

Furthermore, as the surface plasmons excited in the cathode 26 propagate along the interface between the cathode 26 and the electron extraction layer 24, the electromagnetic field caused by the surface plasmons envelops the p-n junction at the interface, thereby resulting in a longer-lasting period of photovoltaic energy conversion. This achieves the same effect as if the incident light had a substantially longer residence time in the organic semiconductor layer 22, thereby improving the photovoltaic energy conversion efficiency of the organic thin-film solar cell 10 according to the embodiment of the present invention in comparison with conventional organic thin-film solar cells.

Here, the light absorbed by the organic semiconductor layer 22 is absorbed by the electron-donating molecules of the organic semiconductor layer 22. When these electron-donating molecules are excited, they transfer electrons to the electron-accepting molecules, and these electrons ultimately flow from the electron-accepting molecules to the cathode 26.

As described above, in the organic thin-film solar cell 10 according to the embodiment of the present invention, a recess and protrusion structure is formed at the interface between the organic semiconductor layer 22 and the cathode 26. Next, this configuration will be described in more detail.

Figure 2A:
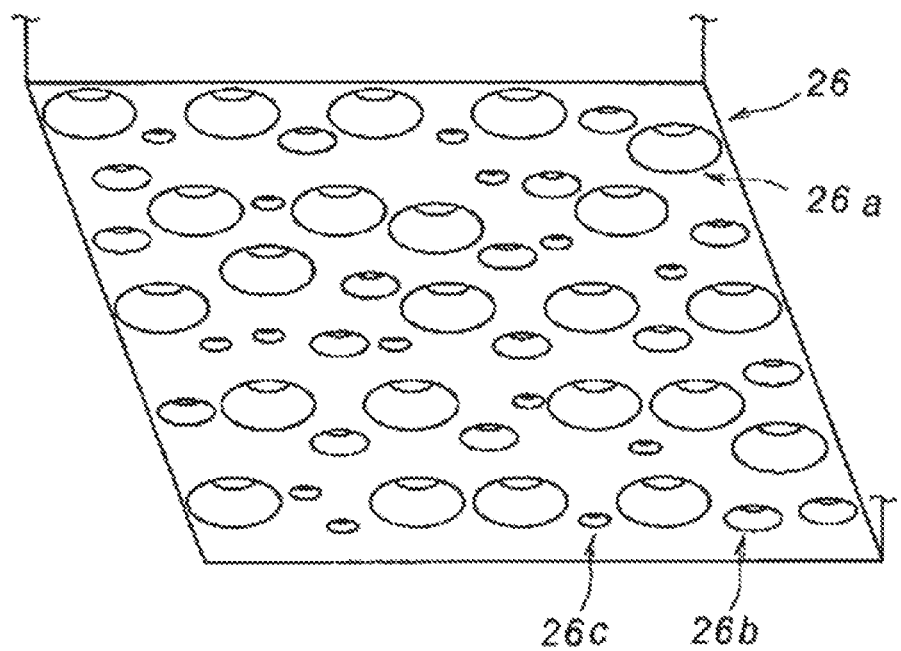
FIG. 2A is a perspective view schematically illustrating a configuration of a recess and protrusion shape formed in the rear surface of a cathode in the organic thin-film solar cell according to the embodiment of the present invention.
Figure 2B:
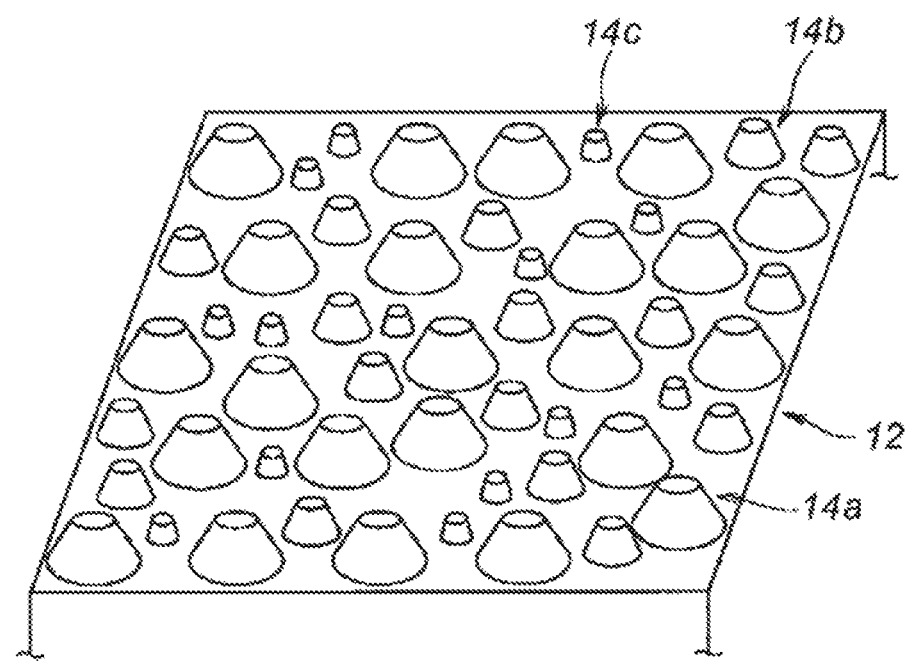
FIG. 2B is a perspective view schematically illustrating a configuration of a microstructure formed in the front surface of a substrate in the organic thin-film solar cell according to the embodiment of the present invention.

First, as illustrated in FIG. 2B, on the surface of the substrate 12 on the side on which the anode 16 is layered, a plurality of protrusions of different diameters such as the protrusions 14a, 14b, and 14c are arranged two-dimensionally at random, thereby forming the recess and protrusion-shaped microstructure 14.

When the anode 16, the hole extraction layer 18, the electron blocking layer 20, the electron-donating layer 22a and the electron-accepting layer 22b of the organic semiconductor layer 22, the electron extraction layer 24, and the cathode 26 are layered in order on top of this microstructure 14, for example, each layer is layered on top of a recess and protrusion structure. Therefore, a recess and protrusion structure similar to the microstructure 14 formed on the front surface of the substrate 12 is formed in the cathode 26-side surface of each layer.

As a result, when the cathode 26 is finally layered on top of the electron extraction layer 24, a recess and protrusion structure similar to the microstructure 14 on the front surface of the substrate 12 is formed on the front surface of the cathode 26. Furthermore, as illustrated in FIG. 2A, a recess and protrusion structure inverted relative to the microstructure 14 on the front surface of the substrate 12 is formed on the rear surface of the cathode 26 (that is, on the electron extraction layer 24-side surface of the cathode 26). This structure (below, referred to simply as an "inverted recess and protrusion structure") includes a plurality of recesses of different diameters such as the recesses 26a, 26b, and 26c that are arranged at random two-dimensionally.

In other words, the diameters and heights of the recesses 26a, 26b, and 26c of the inverted recess and protrusion structure match the diameters and heights of the protrusions 14a, 14b, and 14c, respectively, of the recess and protrusion structure of the microstructure 14. Moreover, the arrangement pattern of the recesses 26a, 26b, and 26c of the inverted recess and protrusion structure matches the arrangement pattern of the protrusions 14a, 14b, and 14c of the microstructure 14.

Here, "match" does not mean that these properties have to be exactly equal but rather that the structure transfer ratio is in the range of 70 to 100%.

Here, "plurality of protrusions (or recesses) arranged at random two-dimensionally" means that a plurality of protrusions such as the protrusions 14a, 14b, and 14c (or a plurality of recesses such as the recesses 26a, 26b, and 26c) are arranged on the same plane and that the distances between the centers of the protrusions or recesses (that is, the geometric centers when viewed from above) as well as the arrangement directions therebetween are not fixed and are irregular. Arranging the plurality of protrusions 14a, 14b, and 14c (or the recesses 26a, 26b, and 26c) at random two-dimensionally causes all wavelengths of light absorbed by the organic semiconductor layer to excite surface plasmons.

Therefore, the organic thin-film solar cell 10 according to the embodiment of the present invention can be manufactured using a method of manufacturing an organic thin-film solar cell that includes, for example, producing a substrate in which a recess and protrusion-shaped microstructure 14 is formed on the front surface of the substrate 12, and layering at least the anode 16, the organic semiconductor layer 22, and the cathode 26 (which is a metal layer) on top of the recess and protrusion-shaped microstructure 14 such that the recess and protrusion shape is duplicated in the rear surface of the cathode 26 (that is, the organic semiconductor layer 22-side surface of the cathode 26). The step of producing the substrate includes forming a particle monolayer film that includes a mixture of particles of different average particle sizes in order to form the microstructure (which has a random recess and protrusion structure), and the microstructure is formed to satisfy the following requirements. In other words, the microstructure 14 is formed such that when $\lambda_1$ and $\lambda_2$ are a shorter wavelength and a longer wavelength, respectively, of wavelengths that produce an absorption edge in a light absorption spectrum of the organic semiconductor layer 22 of the organic thin-film solar cell 10, and $k_1$ and $k_2$ are real parts of propagation constants of surface plasmons that correspond, respectively, to those wavelengths and occur along the interface between the cathode 26 and the organic semiconductor layer 22, a power spectrum of a height distribution of the interface exhibits determinate values between a wavenumber $K_1=k_1$ and a wavenumber $K_2=k_2$, and an integrated value of a spectral intensity of the power spectrum of the height distribution of the interface over this wavenumber range is equal to at least 50% of an integrated value of the spectral intensity of the power spectrum of the height distribution of the interface over all wavenumbers.

This makes it possible to make the photovoltaic energy conversion efficiency of the organic thin-film solar cell 10 greater than the photovoltaic energy conversion efficiency of conventional organic thin-film solar cells.

Next, the requirements for the recess and protrusion structure of the microstructure 14 on the front surface of the substrate 12 will be described.

The use of the recess and protrusion-shaped microstructure 14 in the organic thin-film solar cell 10 according to the embodiment of the present invention originates from the fact that in an organic thin-film solar cell that has a periodic lattice structure, changing parameters such as the pitch and height of the recesses and protrusions of the periodic lattice structure improves the photovoltaic energy conversion efficiency of the organic thin-film solar cell.

Figure 3A:
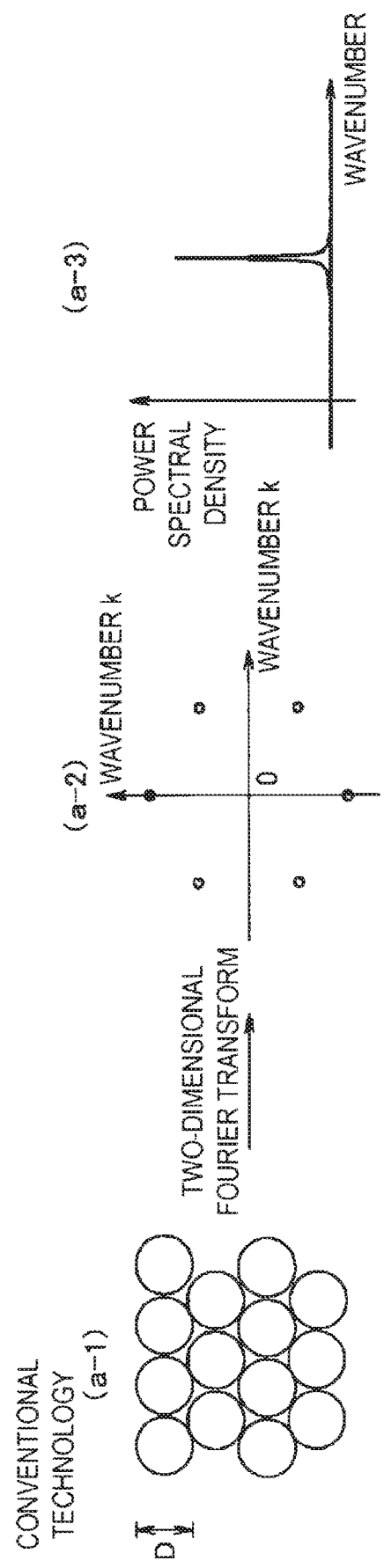
FIG. 3A illustrates a conventional technology that has a periodic microstructure.

For example, FIG. 3A illustrates a conventional technology that employs a periodic recess and protrusion microstructure. FIG. 3A (a-1) illustrates an example of an organic thin-film solar cell that has a periodic lattice structure in which the recess and protrusion structure has a fixed period and is manufactured using a dry etching method in which a two-dimensional crystalline material made from a particle monolayer film with a fixed particle diameter D is used as an etching mask. FIG. 3A (a-2) illustrates the power spectrum of the height distribution of the substrate surface of the organic thin-film solar cell that has a periodic lattice structure in which the recess and protrusion structure has a fixed period.

In other words, when the periodic lattice structure on the surface of the substrate of the organic thin-film solar cell is formed such that the recess and protrusion structure has a fixed period, applying a two-dimensional Fourier transform to the height distribution of the recess and protrusion structure yields a power spectrum in which a sequence of points are positioned at the vertices of an equilateral hexagon and exhibit a delta function shape.

FIG. 3A (a-3) illustrates the power spectrum profile of the height distribution of the periodic lattice structure in which the period of the recess and protrusion structure is fixed.

Here, "power spectrum of the height distribution" refers to a plot of the spectral power intensity (the square of the absolute value of amplitude) obtained by applying a two-dimensional Fourier transform to the height distribution of the recess and protrusion structure to convert that distribution to a wave vector space.

Spectral intensity can be obtained by capturing an AFM image and then applying a two-dimensional Fourier transform to the captured AFM image. It is preferable that the exposure conditions used when capturing the AFM image be configured such that the scan is performed in a square shape in which each side of the square is from 5 to 20 times longer than the average particle diameter of the intermixed particles, for example.

Moreover, "power spectrum profile" refers to a plot in which the spectral power intensity of the power spectrum is integrated over a constant-wavenumber circumference and plotted against wavenumber on the horizontal axis.

The coordinates of each point in the power spectrum space can be expressed as a wave vector $K=(K_x, K_y)$. The absolute value of this wave vector K is given by $|K|=(K_x^2+K_y^2)^{1/2}$ and is also known as the wavenumber. The wavenumber is also equal to spatial frequency multiplied by $2\pi$.

As illustrated in FIG. 3A (a-3), the power spectrum profile of the height distribution exhibits a high intensity and a sharp peak at a particular wavenumber. This indicates that only surface plasmons with that wavenumber are excited. In other words, only light of one particular wavelength contributes to excitation of surface plasmons.

Meanwhile, in the organic thin-film solar cell according to the embodiment of the present invention, arranging the protrusions or recesses two-dimensionally at random to some degree results in light of all of the wavelengths absorbed by the organic semiconductor contributing to excitation of surface plasmons. This results in a longer-lasting period of photovoltaic energy conversion as the excited surface plasmons propagate along the rear surface of the cathode, thereby improving photovoltaic energy conversion efficiency.

Figure 3B:
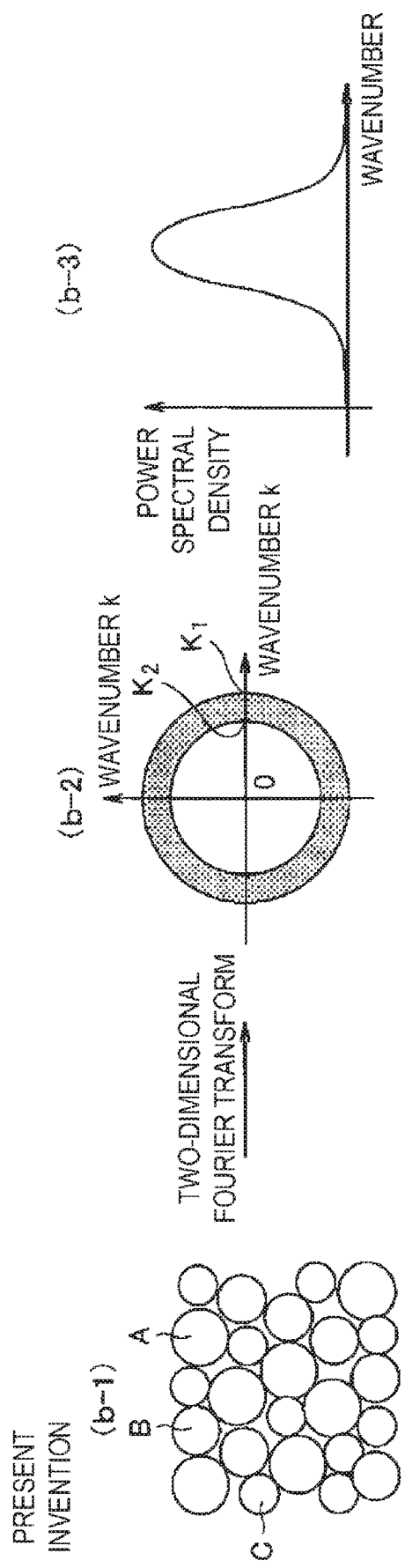
FIG. 3B illustrates the properties the organic thin-film solar cell according to the embodiment of the present invention.

More specifically, as illustrated in FIG. 3B (b-1), in the organic thin-film solar cell 10 according to the embodiment of the present invention, a recess and protrusion structure is formed on the front surface of the substrate of the organic thin-film solar cell using a dry etching process in which a particle monolayer film that includes three types of particles A, B, and C of different particle diameters, for example, is used as a mask. FIG. 3B (b-2) illustrates the resulting power spectrum of the height distribution of the recess and protrusion structure formed on the front surface of the substrate of the organic thin-film solar cell. As illustrated in FIG. 3B (b-2) this power spectrum has a ring-shaped region with a non-zero width rather than the sequence of points that are positioned at the vertices of an equilateral hexagon and exhibit a delta function shape as illustrated in FIG. 3A (a-2) for the conventional technology.

Moreover, arranging the members of the recess and protrusion structure two-dimensionally at random in the organic thin-film solar cell according to the embodiment of the present invention makes it possible to increase, to a certain degree, the range of wavelengths of light absorbed, as illustrated in the profile of the power spectrum of the height distribution in FIG. 3B (b-3).

Here, an ideal "two-dimensional lattice" would be a structure in which the members thereof are arranged at a fixed interval in at least two directions. Examples of such structures include triangular lattices (hexagonal lattices) and square lattices. In the recess and protrusion structure of the present invention, however, the members of such a triangular lattice or square lattice are arranged irregularly (randomized) to a certain degree. Here, "to a certain degree" does not refer to a numerically defined range but simply to a state of arrangement.

Furthermore, "randomized to a certain degree" and "irregular to a certain degree" mean that the members of the recess and protrusion structure are arranged randomly such that the power spectrum of the height distribution of the recess and protrusion structure is distributed widely across a wavenumber region from $K_1$ to $K_2$, for example, rather than exhibiting a delta function-shaped peak at a particular wavenumber. In other words, these phrases refer to the randomness of a recess and protrusion structure that produces a sufficient number of determinate values between a wavenumber K1 and a wavenumber K2 in the power spectrum of the height distribution of the recess and protrusion structure.

Here, "determinate values" refers to non-zero, non-infinite values.

Next, a specific method for determining the particle sizes to use for the particles of the particle monolayer film will be described with reference to FIG. 4. The microstructure 14 of the organic thin-film solar cell 10 is designed according to the spectrum of light (such as sunlight) absorbed by the organic semiconductor layer 22. More specifically, the microstructure 14 is designed such that the recess and protrusion structure thereof results in excitation of surface plasmons (by the light in the absorption spectrum of the organic semiconductor layer 22 of the organic thin-film solar cell 10) in a wavenumber region that is contained within the power spectrum of the height distribution of the recess and protrusion structure.

First, a method for obtaining the wavenumber (also known as the propagation constant) of the surface plasmons excited by light of wavelength λ will be described.

The method for obtaining the wavenumber of these surface plasmons is the same as the method for obtaining the wavenumber of surface plasmons in a layered organic thin-film solar cell that does not include a recess and protrusion structure.

Figure 4:
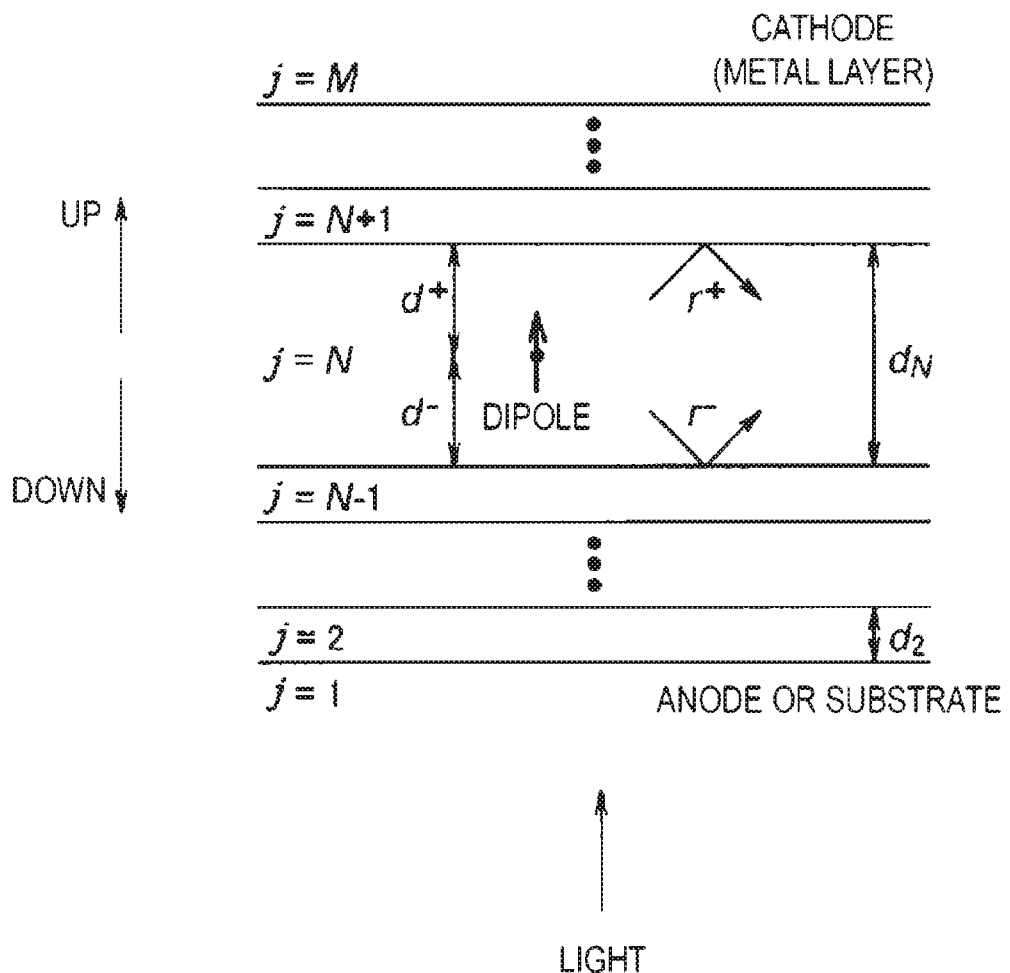
FIG. 4 illustrates a dipole placed in the layered structure of the organic thin-film solar cell according to the embodiment of the present invention.

As illustrated in FIG. 4, if a plurality of layers are layered together from a substrate to a cathode and represented as a first layer to an Mth layer, the first layer being the substrate and the Mth layer being the cathode (a metal layer).

Here, let the thickness of a jth layer of the organic thin-film solar cell be $d_j$, and let the relative permittivity of that jth layer be $\varepsilon_j$.

Here, "thickness of the jth layer" refers to the shortest distance from a point on the front surface of the jth layer to the rear surface of the jth layer. This distance can be obtained by selecting 20 random points on the front surface of the jth layer, measuring the shortest distance from each point to the rear surface of the jth layer, and then averaging the measured values, for example.

For convenience, the thickness $d_m$ of the Mth layer and the thickness $d_1$ of the first layer may be assumed to be infinite.

Next, assume that the Mth layer (for which j=M) is a metal layer that acts as a carrier for surface plasmons. The propagation constant of the surface plasmons that propagate along the rear surface of this Mth layer must be obtained.

The propagation constant of the surface plasmons can be obtained by solving a system of characteristic equations.

In most cases, these characteristic equations cannot be solved analytically and must instead be solved numerically using non-linear optimization techniques. As the total number of parameters in these equations increases, the difficulty of the calculation also increases.

The propagation constant of the surface plasmons is a complex number, and the abovementioned characteristic equations accurately give this complex propagation constant. Here, however, only the real part of the surface plasmon propagation constant is needed, and a technique for obtaining this real part more easily can be applied.

First, the propagation mode of the layered structure (that is, the surface plasmon mode and the waveguide mode) is characterized by the propagation constant. This propagation constant is related to the component of the wavenumber of the propagation mode that is parallel to the interface (below, the real part of the propagation constant will be referred to simply as the "in-plane wavenumber").

If an oscillating dipole is placed within this layered structure, the energy of that dipole is dissipated by each mode of the layered structure. Each mode has a different propagation constant (that is, a different in-plane wavenumber), and therefore studying the dependence of the dissipated energy from the dipole on the in-plane wavenumber makes it possible to identify which propagation modes the layered structure exhibits.

A specific method for calculating the in-plane wavenumber dependence of the dissipated energy from the dipole is given below.

First, one dipole is placed at a point at a distance of approximately 20 nm from the substrate side of an interface (M−1)/M and is arranged perpendicular to that interface. The dipole is placed in a layer that exhibits no absorption or only nominal absorption of the desired angular frequency ω to extract. Let the layer in which the dipole is placed be the Nth layer. FIG. 4 illustrates the layered structure of an organic thin-film solar cell and how the dipole is placed within the layered structure in the Nth layer thereof (for which j=N). In FIG. 4, the dipole is placed within the Nth layer.

The arrows $d^+$ and $d^-$ represent the distances from the dipole to the upper and lower interfaces of the Nth layer, respectively.

Furthermore, let μ be the moment of the dipole, and assume the dipole is oscillating at an extracted angular frequency of ω.

Using the values described above, the in-plane wavenumber dependence ($W(k_\parallel)$, where $k_\parallel$ is the in-plane wavenumber) of energy dissipation from the dipole is given by equation (1), as shown below.

⟨Equation 1⟩

$$W(k_{il}) = \frac{\omega \mu^2}{8\pi\varepsilon N} Re\left[\frac{k_{il}^3}{k_z} \cdot \frac{[1 + r^+\exp(2ik_z d^+)][1 + r^-\exp(2ik_x d^-)]}{1 - r^+ r^-\exp(2ik_z d^+ d^-)}\right] \quad (1)$$

In equation (1), as illustrated in FIG. 4, $r^-$ is the reflection coefficient (the amplitude reflection coefficient) of the interface (N−1)/N as viewed from the Nth layer side to p-polarized light with an in-plane wavenumber $k_\parallel$, and $r^+$ is the reflection coefficient of the interface N/(N+1) as viewed from the Nth layer side to the p-polarized light with the in-plane wavenumber $k^\parallel$. These reflection coefficients include effects from all of the layers from the substrate to the air. Furthermore, $k_z$ is the normal component of the wave vector of the light wave in the Nth layer and is given by $k_\parallel^2 + k_z^2 = \varepsilon_N(\omega/c)^2$. c is the speed of light in vacuum. $W(k_\parallel)$ is the in-plane wavenumber dependence of energy dissipation in the organic thin-film solar cell. μ is the moment of the dipole, ω is the extracted angular frequency, and i is the imaginary unit.

The local maximums of the in-plane wavenumber dependence $W(k_\parallel)$ of energy dissipation correspond to the propagation modes, and the in-plane wavenumber ($k_\parallel$) that produces a local maximum is the real part of the propagation constant for that mode.

Of the wavenumbers that produce these local maximums, the mode with the largest wavenumber is the surface plasmon mode.

Figure 5:
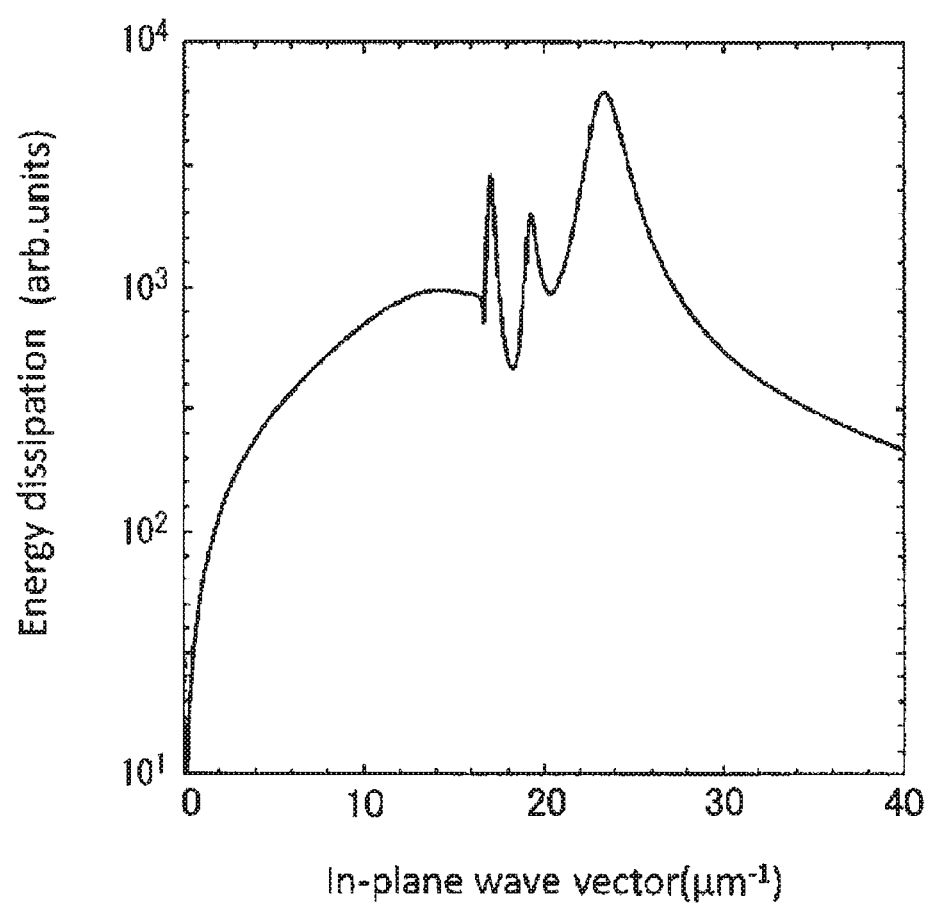
FIG. 5 is a graph showing energy dissipation in the organic thin-film solar cell according to the embodiment of the present invention when a dipole is placed at a distance of 20 nm from the rear surface of the cathode on the substrate side thereof. The vertical axis is energy dissipation, and the horizontal axis is the in-plane wavevector.

FIG. 5 is an energy dissipation plot showing the energy dissipation results calculated when a dipole is placed at a distance of 20 nm from the rear surface of the cathode (the metal layer) on the substrate side thereof in the organic thin-film solar cell.

Here, "energy dissipation plot" refers to a graph of which in-plane wave vectors energy is dissipated along when the dipole is placed in the device. This plot makes it possible to identify the in-plane wavenumbers of modes such as the surface plasmon mode and the waveguide mode.

Next, the method described above for calculating the propagation constant of the surface plasmons will be applied to the recess and protrusion structure of the bottom surface (substrate surface)-light receiving organic thin-film solar cell in which the front surface of the cathode is also recess and protrusion-shaped.

Of the wavelengths that produce absorption edges in the light absorption spectrum of the organic semiconductor material of this device, let the shorter wavelength be $\lambda_1$ and the longer wavelength be $\lambda_2$. For each wavelength $\lambda_1$ and $\lambda_2$, the real part of the propagation constant of the corresponding surface plasmons at the interface between the cathode and the organic semiconductor layer must be obtained.

Here, "absorption edges in the light absorption spectrum" refers to characteristic wavelengths that exhibit an absorptivity of 0.2 times the maximum absorptivity at a maximum absorption wavelength λmax and occur on the longer and shorter wavelength sides of the maximum absorption wavelength.

First, the wavenumber $k_1$ of the surface plasmons corresponding to $\lambda_1$ will be obtained. W (the in-plane wavenumber dependence) is calculated using the angular frequency corresponding to $\lambda_1$, the permittivity of each layer, and equation (1).

In the energy dissipation plot obtained by calculating W in this way, the rightmost peak corresponds to the wavenumber $k_1$.

Next, the wavenumber $k_2$ of the surface plasmons corresponding to $\lambda_2$ will be obtained using the same method. In other words, W (the in-plane wavenumber dependence) is calculated using the angular frequency corresponding to $\lambda_2$, the permittivity of each layer, and equation (1).

In the energy dissipation plot obtained by calculating W in this way, the rightmost peak corresponds to the wavenumber $k_2$.

The recess and protrusion structure on the front surface of the substrate is formed such that the power spectrum of the height distribution of the recess and protrusion structure of the interface between the cathode and the organic semiconductor layer (which is determined by the wavenumbers $k_1$ and $k_2$ of the surface plasmons obtained as described above) exhibits determinate values between the wavenumbers $K_1=k_1$ and $K_2=k_2$.

In other words, in the organic thin-film solar cell according to the embodiment of the present invention, the recess and protrusion structure is formed on the front surface of the substrate such that, when the real part $k_1$ of the propagation constant of the surface plasmons obtained using the method described above is an upper wavenumber limit $K_1$ in the power spectrum of the height distribution of the recess and protrusion structure on the interface and the real part $k_2$ of the propagation constant of the surface plasmons obtained using the method described above is a lower wavenumber limit $K_2$ in the power spectrum of the height distribution of the recess and protrusion structure on the interface, the power spectrum of the height distribution of the recess and protrusion structure on the front surface of the substrate exhibits determinate values between the upper wavenumber limit $K_1$ and the lower wavenumber limit $K_2$, and an integrated value of a spectral intensity of the power spectrum of the height distribution in a wavenumber range from $K_1$ to $K_2$ is equal to at least 50% of an integrated value of the spectral intensity of the power spectrum of the height distribution over all wavenumbers.

Moreover, in a layering process described below, a recess and protrusion structure similar to the recess and protrusion structure formed on the front surface of the substrate is also formed in the interface between the organic semiconductor layer and the cathode.

Therefore, in one aspect of the organic thin-film solar cell according to the embodiment of the present invention, the recess and protrusion structure is formed in the interface between the organic semiconductor layer and the cathode such that, when the real part $k_1$ of the propagation constant of the surface plasmons is an upper wavenumber limit $K_1$ in the power spectrum of the height distribution of the recess and protrusion structure on the interface and the real part $k_2$ of the propagation constant of the surface plasmons is a lower wavenumber limit $K_2$ in the power spectrum of the height distribution of the recess and protrusion structure on the interface, the power spectrum of the height distribution of the recess and protrusion structure exhibits determinate values between the wavenumber $K_1$ and the wavenumber $K_2$, and an integrated value of a spectral intensity of the power spectrum of the height distribution in a wavenumber range from $K_1$ to $K_2$ is equal to at least 50% of an integrated value of the spectral intensity of the power spectrum of the height distribution over all wavenumbers.

In other words, one aspect of the organic thin-film solar cell according to the embodiment of the present invention includes:
an organic thin-film solar cell substrate;
an anode;
an organic thin-film layer that includes an organic semiconductor layer; and
a cathode,
the anode, the organic thin-film layer that includes the organic semiconductor layer, and the cathode being layered in order on top of the substrate,
a recess and protrusion-shaped microstructure that includes a plurality of recesses or protrusions arranged two-dimensionally at random being formed in an interface between the organic thin-film layer and the cathode, and
the recess and protrusion-shaped microstructure being formed such that,
when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and
when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer,
the power spectrum of the height distribution of the microstructure exhibits determinate values between the upper wavenumber limit $K_1$ and the lower wavenumber limit $K_2$, and an integrated value of a spectral intensity of the power spectrum of the height distribution in a wavenumber range from $K_1$ to $K_2$ is equal to at least 50% of an integrated value of the spectral intensity of the power spectrum of the height distribution over all wavenumbers.

Another aspect of the organic thin-film solar cell according to the embodiment of the present invention includes:
an organic thin-film solar cell substrate;
an anode;
an organic thin-film layer that includes an organic semiconductor layer; and
a cathode,
the anode, the organic thin-film layer that includes the organic semiconductor layer, and the cathode being layered in order on top of the substrate,
a recess and protrusion-shaped microstructure that includes a plurality of recesses or protrusions arranged two-dimensionally at random being formed in a surface of the substrate,
the recess and protrusion-shaped microstructure being duplicated at interfaces between the anode, the organic thin-film layer, and the cathode, and
the recess and protrusion-shaped microstructure being formed such that,
when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and
when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer, the power spectrum of the height distribution of the microstructure exhibits determinate values between the upper wavenumber limit $K_1$ and the lower wavenumber limit $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution over all wavenumbers.

In the present invention, it is preferable that the recess and protrusion structure be adjusted such that the integrated value of the spectral intensity of the power spectrum of the height distribution over the wavenumber range from $K_1$ to $K_2$ is greater than or equal to 50% and less than or equal to 100% of the integrated value of the spectral intensity of the power spectrum of the height distribution over all wavenumbers. The higher this percentage, the more preferable the structure.

In conventional technologies, the integrated value of the spectral intensity of the power spectrum of the height distribution over a prescribed wavenumber range was less than 50% of the integrated value of the spectral intensity of the entire power spectrum of the height distribution, meaning that the absolute amount of energy that can be extracted is small. However, in the organic thin-film solar cell according to the embodiment of the present invention, the integrated value of the spectral intensity of the power spectrum of the height distribution over a prescribed wavenumber range is greater than or equal to 50% of the integrated value of the spectral intensity of the entire power spectrum of the height distribution, thereby achieving a prescribed effect.

Furthermore, the anode 16, the hole extraction layer 18, the electron blocking layer 20, the electron-donating layer 22a and the electron-accepting layer 22b of the organic semiconductor layer 22, the electron extraction layer 24, and the cathode 26 (the uppermost layer) are layered in order on top of the microstructure 14 formed in the front surface of the substrate 12. Therefore, the recess and protrusion structure of the substrate 12 is duplicated in the surface of the other layers, and a recess and protrusion structure similar to the recess and protrusion structure formed in the substrate 12 is formed in the front surface of each of the other layers.

Meanwhile, an inverted recess and protrusion structure that has the same recess and protrusion shape as the microstructure 14 described above but is inverted relative thereto is formed in the rear surfaces of the anode 16, the hole extraction layer 18, the electron blocking layer 20, the electron-donating layer 22a and the electron-accepting layer 22b of the organic semiconductor layer 22, the electron extraction layer 24, and the cathode 26.

The thickness of each layer of the organic thin-film solar cell 10 can be measured using a spectroscopic ellipsometer, a contact profilometer, an atomic force microscope (AFM), or the like.

The thickness of each layer can then be measured by selecting 20 protrusions at random on the front surface of the layer, measuring the shortest distance from the apex of each protrusion to the rear surface of the layer, and then averaging the measured values, for example.

Furthermore, one aspect of a method of manufacturing the organic thin-film solar cell 10 according to the embodiment of the present invention includes: producing the substrate 12 in which the recess and protrusion-shaped microstructure 14 that includes a plurality of recesses or protrusions arranged two-dimensionally at random is formed in the front surface of the substrate 12 by using a dry etching process in which a particle monolayer film is used as an etching mask; and layering at least the anode, the organic semiconductor layer that includes the electron-donating layer and the electron-accepting layer, and the cathode on top of the microstructure such that the recess and protrusion shape of the microstructure is duplicated in the front surface of the cathode.

Furthermore, in the step of producing the substrate in the method of manufacturing the organic thin-film solar cell, it is preferable that the particle monolayer film be produced using a mixture of particles of different average particle sizes and that a recess and protrusion shape that satisfies the requirements described below be formed in the front surface of the substrate using the particle monolayer film.

It is preferable that the average height of the recess and protrusion structure of the microstructure 14 formed in the front surface of the substrate of the organic thin-film solar cell according to the embodiment of the present invention be greater than or equal to 15 nm and less than or equal to 180 nm.

Here, "average height of the recess and protrusion structure" refers to the average heights of the protrusions 14a, 14b, and 14c on the substrate 12 as illustrated in FIG. 2B. These values can be measured using the measurement method described below.

It is preferable that the average heights of the protrusions 14a, 14b, and 14c be greater than or equal to 15 nm and less than or equal to 180 nm and more preferable that the average heights be greater than or equal to 20 nm and less than or equal to 100 nm.

The average heights of the protrusions of the recess and protrusion structure can be measured using an atomic force microscope (AFM).

More specifically, first, an AFM image of a 5 μm×5 μm region selected at random from the overall recess and protrusion structure region is captured.

In the resulting AFM image, brightness varies according to the height of the protrusions. Areas with taller protrusions appear brighter, and areas with shorter protrusions appear dimmer.

Note that this AFM image can be captured using any well-known technology, and therefore a description of the capture method is omitted here.

Next, a straight line is drawn diagonally across the selected 5 μm×5 μm region in the captured AFM image. The heights of the protrusions 14a, 14b, and 14c that fall on this line are measured, and then average values of these measured heights are calculated.

Here, height is measured using the following procedure. When the front surface of the substrate is viewed from the direction orthogonal thereto (that is, from the layering direction), a given protrusion X0 will be surrounded by adjacent protrusions X1, X2, X3, . . . , Xn. Letting the saddle point of the saddle between the protrusion X0 and the protrusion X1 be x1, and likewise, letting the saddle points of the saddles between the protrusion X0 and the other protrusions be x2, x3, . . . , xn, the height of the protrusion X0 is measured as the difference in height between the height of the center of the protrusion X0 and the average height of the saddle points x1 to xn.

This process is repeated for a total of 25 5 μm×5 μm regions selected at random, and then the average heights of the protrusions 14a, 14b, and 14c are calculated for each region. Next, the average values for each of the 25 regions are averaged together to obtain the average heights of the protrusions 14a, 14b, and 14c.

In the present invention, the average heights of the protrusions are greater than or equal to 15 nm and less than or equal to 180 nm.

The method for forming the protrusions will be described in more detail later, but note here that the average heights of the protrusions can be adjusted by adjusting the dry etching conditions used when performing the dry etching process in which the particle monolayer film is used as an etching mask.

Note that as illustrated in FIGS. 2A and 2B, the diameters and average depths of the recesses 26a, 26b, and 26c of the inverted recess and protrusion structure are equal to the diameters and average heights of the protrusions 14a, 14b, and 14c, respectively. Therefore, the average depths of the recesses can be indirectly quantified by using the average heights of the protrusions.

<Method of Manufacturing>

Above, the materials used for each layer of the organic thin-film solar cell according to the embodiment of the present invention were described. Next, the methods used to produce each layer of the organic thin-film solar cell will be described in detail.

It is preferable that a layering method be used as the method of manufacturing an organic thin-film solar cell according to the embodiment of the present invention.

Here, "layering method" refers to a method in which layers are layered on in order one layer at a time starting from the layer at the bottom of the organic thin-film solar cell 10.

In other words, in the method of manufacturing the organic thin-film solar cell 10 according to the embodiment of the present invention, first the substrate 12 on which is formed the microstructure 14 that is a recess and protrusion structure in which a plurality of three types of protrusions 14a, 14b, and 14c of different diameters are arranged two-dimensionally at random is produced (in the present specification, this process will be referred to as the "substrate production process").

Next, the anode 16, the hole extraction layer 18, the electron blocking layer 20, the organic semiconductor layer 22, the electron extraction layer 24, and the cathode conductive layer 26 (that is, the cathode 26) are layered in order on top of the microstructure 14 of the substrate 12.

A method of manufacturing an organic thin-film solar cell that includes an organic thin-film solar cell substrate and an anode, an organic thin-film layer including an organic semiconductor layer, and a cathode layered in order on top of the substrate, the method including:

forming a particle monolayer film that includes a mixture of particles of different average particle sizes on a surface of the substrate;

dry etching using the particle monolayer film as an etching mask to form a microstructure that includes a plurality of recesses or protrusions arranged two-dimensionally at random on the surface of the substrate; and layering at least the anode, the organic thin-film layer, and the cathode on top of the substrate such that a shape of the microstructure formed in the dry etching step is duplicated in interfaces between the anode, the organic thin-film layer, and the cathode.

In this method of manufacturing an organic thin-film solar cell, it is preferable that the recess and protrusion-shaped microstructure be formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer, the power spectrum of the height distribution of the microstructure exhibits determinate values between the wavenumber $K_1$ and the wavenumber $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution over all wavenumbers.

<Substrate Production Process>

First, the recess and protrusion structure that includes the plurality of protrusions 14a, 14b, and 14c of the microstructure 14 formed in the front surface of the substrate 12 can be produced by performing a dry etching process using a particle monolayer film formed using a mixture of particles of different particle sizes (below, referred to simply as a "particle mixture") as an etching mask, for example. Here, "a mixture of particles of different particle sizes" refers to any mixture that contains a plurality of particles of different particle sizes.

In the dry etching process in which the particle monolayer film is used as an etching mask, a monolayer film of particles is formed on the front surface of a substrate original plate (the substrate before the recess and protrusion structure is formed) using the Langmuir-Blodgett technique (below, simply "LB technique"). This monolayer film is used as an etching mask while dry etching the front surface of the substrate original plate to form the recess and protrusion structure. This process is disclosed in detail in Japanese Unexamined Patent Application Publication No. 2009-158478A, for example.

In conventional methods, a single size of particles are used and the particle spacing is controlled with high precision in order to obtain the closest-packed two-dimensional lattice.

In other words, when a single size of particles are used to form the particle monolayer film, the particles take the closest-packed two-dimensional structure possible. Therefore, when this particle monolayer film is used as an etching mask to dry etch the front surface of the substrate original plate, the resulting recess and protrusion structure is formed with a high-precision two-dimensional triangular lattice (hexagonal lattice) structure.

In the present invention, a particle mixture that includes a plurality of types of particles (three types in the example presented here) of different particle sizes (that is, different average particle sizes) is used for the particles used to form the particle monolayer film.

Here, selecting average particle sizes that are relatively close to one another effectively achieves the effects of the present invention. However, there are no specific standards for how close the average particle sizes should be. Any average particle sizes may be selected and used in combination as long as the power spectrum of the height distribution of the resulting recess and protrusion microstructure exhibits determinate values between the upper wavenumber limit $K_1$ and the lower wavenumber limit $K_2$ and the integrated value of the spectral intensity of the power spectrum of the height distribution over a wavenumber range from $K_1$ to $K_2$ is equal to at least 50% of the integrated value of the spectral intensity of the power spectrum of the height distribution over all wavenumbers.

As described above, the microstructure resulting from using this particle monolayer film includes the plurality of protrusions 14a, 14b, and 14c of different diameters arranged two-dimensionally at random.

More specifically, the substrate 12 can be produced using a method that includes coating the front surface of the substrate original plate (that is, the substrate before the recess and protrusion structure is formed) with a particle monolayer film made from a particle mixture and then dry etching the substrate original plate using the particle monolayer film as an etching mask.

Moreover, using this type of substrate that has a recess and protrusion structure results in formation of a similarly high-precision recess and protrusion structure in the rear surface 26b of the cathode 26. Therefore, using this method makes it possible to achieve excitation of surface plasmons and also makes it possible to provide an organic thin-film solar cell 10 with improved photovoltaic energy conversion efficiency.

Next, the abovementioned coating process and dry etching process will be described in more detail.
(Coating Process)

The process for coating the front surface of the substrate original plate (that is, the substrate before the recess and protrusion structure is formed) with a particle monolayer film includes: forming a particle monolayer film by loading a liquid for spreading the particle mixture on the liquid surface thereof into a trough (below, the liquid for spreading the particle mixture on the liquid surface thereof will be referred to simply as the "lower layer liquid"), dripping a dispersion liquid produced by dispersing the particle mixture in an organic solvent onto the liquid surface of the lower layer liquid, and then vaporizing the organic solvent in the dripped dispersion liquid in order to form a particle monolayer film made from the particle mixture on the liquid surface of the lower layer liquid; and transferring the particle monolayer film to the substrate 12.

In other words, the process for coating the front surface of the substrate original plate with an etching mask includes a step for forming just the particle monolayer film and a step for transferring the particle monolayer film thus formed onto the front surface of the substrate original plate.

Furthermore, one aspect of the coating process includes:
  forming a particle monolayer film on the front surface of a substrate original plate; and
  transferring the particle monolayer film thus formed onto the front surface of the substrate original plate,
    the step of forming the particle monolayer film including:
    loading a lower layer liquid for spreading the particle mixture on the liquid surface thereof into a trough,
    dripping a dispersion liquid produced by dispersing the particle mixture in an organic solvent onto the liquid surface of the lower layer liquid, and
    vaporizing the organic solvent in the dripped dispersion liquid in order to form a particle monolayer film made from the particle mixture on the liquid surface of the lower layer liquid.

The coating process may also include applying a hydrophobizing treatment to make the particle mixture hydrophobic.

The coating process may also include fixing the particle monolayer film to the substrate original plate after the transferring step.

In the following description, a hydrophilic liquid is used as the lower layer liquid, and an organic solvent and a particle mixture that contain hydrophobic ingredients are used in the dispersion liquid. Alternatively, a hydrophobic liquid may be used as the lower layer liquid, and an organic solvent and a particle mixture that contain hydrophilic ingredients may be used.

Next, the particle monolayer film formation step and the transferring step will be described in detail.
(Particle Monolayer Film Formation Step)

The particle monolayer film formation step in which the particle monolayer film is formed coating the front surface of the substrate original plate is included in the abovementioned coating process. However, in the method of manufacturing the organic thin-film solar cell according to the embodiment of the present invention, a process in which the particle monolayer film is obtained by spreading a solvent that contains a particle mixture over the surface of a prescribed solvent contained in a trough will be described for the particle monolayer film formation step.

In the particle monolayer film formation step of the method of manufacturing an organic thin-film solar cell according to the embodiment of the present invention, first, a particle mixture in which the surfaces of the particles are hydrophobic is dispersed in a highly volatile organic solvent (such as chloroform, methanol, ethanol, methyl ethyl ketone, methyl isobutyl ketone, or hexane) to prepare a dispersion liquid. Also, a trough is prepared and partially filled with water as the lower layer liquid (below, the water that functions as the lower layer liquid will be referred to as the "lower layer water").

Next, a particle mixture that contains three types of particles of different average particle sizes is dispersed in a prescribed solvent such as an organic solvent to prepare the dispersion liquid.

Here, it is preferable that the surfaces of the three types of particles be hydrophobic and that particles A, particles B, and particles C of different average particle sizes (where the average particle sizes of these particles satisfies A>B>C) be used.

It is preferable that a highly volatile solvent (such as chloroform, methanol, ethanol, methyl ethyl ketone, methyl isobutyl ketone, or hexane) be used as the prescribed solvent in which the particles A, B, and C are dispersed.

The three types of particles A, B, and C are added and mixed into the solvent to prepare the dispersion liquid in which the three types of the particles A, B, and C are dispersed in the solvent.

It is preferable that the concentration of the particles in the dispersion liquid (that is, the total concentration of the particles A, B, and C) be from 1 to 20 m % relative to the total mass of the dispersion liquid.

Next, the dispersion liquid in which the particles A, B, and C are dispersed is dripped onto the surface of the lower layer water in the trough, thereby spreading the dispersion liquid over the liquid surface of the lower layer water in the trough.

It is preferable that the speed at which the dispersion liquid is dripped onto the liquid surface of the lower layer water be from 0.001 to 10 mL/sec and more preferable that the dripping speed be from 0.005 to 0.1 mL/second.

It is preferable that the concentration of particles in the dispersion liquid and the dripping speed be set to values in the ranges given above because this reduces the occurrence of undesirable effects such as partial agglomeration of the particles into clusters that have two or more layers and formation of defect regions in which no particles are present.

Next, a particle mixture that contains three types of particles of different average particle sizes is dispersed in a prescribed solvent such as an organic solvent to prepare the dispersion liquid.

Here, it is preferable that the surfaces of the three types of particles be hydrophobic and that particles A, particles B, and particles C of different average particle sizes (where the average particle sizes of these particles satisfies A>B>C) be used.

It is preferable that a highly volatile solvent (such as chloroform, methanol, ethanol, methyl ethyl ketone, methyl isobutyl ketone, or hexane) be used as the prescribed solvent in which the particles A, B, and C are dispersed.

The three types of particles A, B, and C are added and mixed into the solvent to prepare the dispersion liquid in which the three types of the particles A, B, and C are dispersed in the solvent.

It is preferable that the concentration of the particles in the dispersion liquid (that is, the total concentration of the particles A, B, and C) be from 1 to 20 m % relative to the total mass of the dispersion liquid.

Next, the dispersion liquid in which the particles A, B, and C are dispersed is dripped onto the surface of the lower layer water in the trough, thereby spreading the dispersion liquid over the liquid surface of the lower layer water in the trough.

It is preferable that the speed at which the dispersion liquid is dripped onto the liquid surface of the lower layer water be from 0.001 to 0.01 mL/sec.

It is preferable that the concentration of particles in the dispersion liquid and the dripping speed be set to values in the ranges given above because this reduces the occurrence of undesirable effects such as partial agglomeration of the particles into clusters that have two or more layers and formation of defect regions in which no particles are present.

After the dispersion liquid is dripped, it is left alone for a prescribed period of time to let the organic solvent in the dispersion liquid evaporate. This results in formation of a particle monolayer film in which the particles A, B, and C of the particle mixture are closely packed two-dimensionally on the liquid surface of the lower layer liquid in the trough.

Here, the particle sizes of the three types of particles A, B, and C are selected such that, as described above, when the substrate is dry etched to form the recess and protrusion structure that includes the protrusions 14a, 14b, and 14c of different diameters that are arranged two-dimensionally at random, the power spectrum of the height distribution of the resulting recess and protrusion structure exhibits determinate values between the wavenumbers $K_1$ and $K_2$.

More specifically, a particle size that corresponds to the center wavelength of the absorption band of the organic semiconductor is selected for the particles B, and the particles A and the particles C are mixed in as appropriate so that the power spectrum of the height distribution of the resulting recess and protrusion structure exhibits determinate values between the wavenumbers $K_1$ and $K_2$.

In the present invention, using the particle mixture results in variations in the diameters and distances between the centers of the plurality of protrusions in the resulting recess and protrusion structure. This variation makes the range of wavenumbers in which the spectral intensity exhibits determinate values wider than in a configuration in which such variation is not present.

After the dispersion liquid is dripped, it is left alone for a prescribed period of time (10 to 60 seconds, for example) to let the organic solvent evaporate from the dispersion liquid. This results in formation of a particle monolayer film in which the particles A, B, and C of the particle mixture are closely packed two-dimensionally on the liquid surface of the lower layer liquid in the trough.

Here, it is preferable that the particle sizes of the three types of particles A, B, and C be selected such that, as described above, when the substrate is dry etched to form the recess and protrusion structure that includes the protrusions 14a, 14b, and 14c of different diameters that are arranged two-dimensionally at random, the power spectrum of the height distribution of the resulting recess and protrusion structure exhibits determinate values between the upper wavenumber limit $K_1$ and the lower wavenumber limit $K_2$.

More specifically, particles of a particle size that corresponds to the center wavelength of the absorption band of the organic semiconductor are selected for the particles B, and the particles A and the particles C are mixed in as appropriate so that the power spectrum of the height distribution of the resulting recess and protrusion structure exhibits its determinate values between the upper wavenumber limit $K_1$ and the lower wavenumber limit $K_2$.

In the present invention, using the particle mixture results in variations in the diameters and distances between the centers of the plurality of protrusions in the resulting recess and protrusion structure. This variation in the present invention makes the range of wavenumbers in which the spectral intensity exhibits determinate values wider than in a configuration in which such variation is not present.

The range of wavenumbers in which the spectral intensity exhibits determinate values can be adjusted by changing parameters such as the diameters of the plurality of protrusions of the recess and protrusion structure as well as the distances between the centers of adjacent protrusions therein, the particle size distribution or average particle size of each of the three types of particles A, B, and C, and the ratios in which the three types of particles A, B, and C are mixed together.

Based on the conditions described above, it is preferable that the average particle size of each of the three types of particles A, B, and C be greater than or equal to 10 nm and less than or equal to 2000 nm and more preferable that the average particle sizes be greater than or equal to 50 nm and less than or equal to 1700 nm.

Here, "particle size" refers to the size of the primary particles in each type of particles, which can be obtained using a well-known method from the peak observed when the particle size distribution as measured using dynamic light scattering is fit to a Gaussian curve. Alternatively, the particles can be observed directly in an AFM image or an SEM image, and the particle sizes can be measured from those images.

"Average particle size" refers to the average value of at least 20 points of particle size data obtained using the methods described above.

In the example described above, three types of particles of different average particle sizes are used. However, the present invention is not limited to this example, and any number of types of particles of different average particle sizes may be used as long as that number is at least two.

From the perspective of equalizing the improvement in the photovoltaic energy conversion efficiency, it is preferable that 2 to 20 types of particles be used.

Examples of materials for the three types of particles A, B, and C include metals such as Al, Au, Ti, Pt, Ag, Cu, Cr, Fe, Ni, Si, and W; metal oxides such as $SiO_2$, $Al_2O_3$, $TiO_2$, $MgO_2$, and $CaO_2$; nitrides such as SiN and TiN; carbides such as SiC and WC; organic polymers such as polystyrene and polymethyl methacrylate; other semiconductor materials; and inorganic polymers. Any combination of at least two of these materials may be used.

The heights and shapes of the protrusions 14a, 14b, and 14c can be adjusted by appropriately selecting the materials for the three types of particles A, B, and C and the below mentioned dry etching conditions, thereby also making it possible to adjust the depths and shapes of the recesses 26a, 26b, and 26c.

Moreover, as another condition, when water is used as the lower layer liquid, it is preferable that the surfaces of the three types of particles A, B, and C be made from a hydrophobic material.

It is preferable that the surfaces of the three types of particles be hydrophobic because when spreading the dispersion liquid that contains the particles over the liquid surface of the lower layer liquid in the trough to form the particle monolayer film as described above, this hydrophobic property makes it possible to easily form the particle monolayer film using water as the lower layer liquid and also makes it possible to easily transfer the particle monolayer film to the front surface of the substrate.

Of the examples of materials for the three types of particles listed above, particles made from an organic polymer such as polystyrene have hydrophobic surfaces. Such particles can be used as-is, or a hydrophobic agent can be used to change the surfaces of particles made from a metal or a metal oxide that is normally hydrophilic into hydrophobic surfaces.

Examples of such hydrophobic agents include surfactants and alkoxysilanes.

Surfactants are effective in making a wide range of materials hydrophobic and are suitable for use when the particles are made from a material such as a metal or a metal oxide.

Examples of surfactants that can be suitably used as hydrophobic agents include cationic surfactants such as hexadecyltrimethylammonium bromide and decyltrimethylammonium bromide as well as anionic surfactants such as sodium dodecyl sulfate and sodium 4-octylbenzenesulfonate. Furthermore, an alkanethiol, a disulphide compound, tetradecanoic acid, octadecanoic acid, or the like may be used.

This hydrophobic treatment that employs a surfactant may be applied with the particles dispersed in a liquid such as an organic solvent or water or may be applied with the particles in a dry state.

When applying the treatment in a liquid, the particles to make hydrophobic may be dispersed in at least one volatile organic solvent selected from a group consisting of chloroform, methanol, ethanol, isopropanol, acetone, methyl ethyl ketone, ethyl ethyl ketone, toluene, n-hexane, cyclohexane, ethyl acetate, and butyl acetate, or the like, and then the surfactant may be mixed in and the particles may be further dispersed. Dispersing the particles first and then adding the surfactant in this way makes it possible to make the surfaces of the particles more uniformly hydrophobic. The dispersion liquid resulting from this hydrophobic treatment may be used as-is as the dispersion liquid to be dripped onto the liquid surface of the lower layer water.

When the particles to make hydrophobic are dispersed in water, adding the surfactant to the water dispersion to apply the hydrophobic treatment to the surfaces of the particles while in an aqueous phase and then adding the organic solvent and using an oil phase extraction method to extract the particles to which the hydrophobic treatment has been applied is also effective. The dispersion liquid thus obtained (that is, the dispersion liquid in which the particles are dispersed in the organic solvent) may be used as-is as the dispersion liquid to be dripped onto the liquid surface of the lower layer water.

Moreover, it is preferable that the type of organic solvent and the type of surfactant used be selected appropriately in a combination that increases the dispersibility of the particles in the dispersion liquid. Using a dispersion liquid that exhibits high particle dispersibility makes it possible to reduce agglomeration of the particles into clusters, thereby making it easier to obtain a particle monolayer film in which a plurality of particle mixtures are arranged two-dimensionally at random. When chloroform is selected as the organic solvent, for example, it is preferable that decyltrimethylammonium bromide be used as the surfactant. Other examples of preferable combinations include ethanol and sodium dodecyl sulfate, methanol and sodium 4-octylbenzenesulfonate, and methyl ethyl ketone and octadecanoic acid.

It is preferable that the ratios of the particles to make hydrophobic and the surfactant be set such that the amount of surfactant is from 1 to 20 m % relative to the total mass of the particles to make hydrophobic.

Furthermore, during this hydrophobic treatment, agitating the dispersion liquid or irradiating the dispersion liquid with ultrasonic waves effectively increases the particle dispersibility.

When the particles to make hydrophobic are made from a material such as Si, Fe, or Al or an oxide such as $SiO_2$, $Al_2O_3$, or $TiO_2$, using an alkoxysilane as the hydrophobic agent is effective.

It should be noted that alkoxysilanes can be used not just for these types of particles but also for any types of particles that have hydroxyl groups or the like on the surfaces thereof.

Examples of alkoxysilanes include monomethyl trimethoxysilane, monomethyl triethoxy silane, dimethyl diethoxy silane, phenyl triethoxy silane, hexyl trimethoxy silane, decyl trimethoxy silane, vinyl trichlorosilane, vinyl trimethoxysilane, vinyl triethoxysilane, 2-(3,4 epoxycyclohexyl)ethyl trimethoxysilane, 3-glycidoxypropyl trimethoxysilane, 3-glycidoxypropyl methyl diethoxy silane, 3-glycidoxypropyl triethoxy silane, p-styryl trimethoxysilane, 3-methacryloxy propyl methyl dimethoxy silane, 3-methacryloxypropyl trimethoxy silane, 3-methacryloxy propyl methyl diethoxy silane, 3-methacryloxypropyl triethoxy silane, 3-acryloxy propyl trimethoxy silane, N-2(aminoethyl) 3-aminopropylmethyldimethoxysilane, N-2(aminoethyl) 3-aminopropyltrimethoxysilane, N-2(aminoethyl) 3-aminopropyltriethoxysilane, N-phenyl-3-aminopropyltrimethoxysilane, 3-ureidopropyltriethoxysilane, 3-chloropropyl trimethoxy silane, 3-mercaptopropyl methyl dimethoxysilane, 3-mercaptopropyl trimethoxysilane, and 3-isocyanate propyl triethoxysilane.

Among these, monomethyl trimethoxysilane, phenyl triethoxy silane, and the like are preferable.

When using an alkoxysilane as the hydrophobic agent, the alkoxysilyl groups in the alkoxysilane undergo hydrolysis to form silanol groups, and these silanol groups undergo a dehydration condensation reaction with the hydroxyl groups on the surfaces of the particles, thereby making the particles hydrophobic. Therefore, when applying the hydrophobic treatment using an alkoxysilane, it is preferable that the treatment be performed in water.

When performing the hydrophobic treatment in water, it is preferable that a dispersant such as a surfactant also be used to stabilize the dispersion state of the particle mixture before the hydrophobic treatment is performed. However, because certain types of dispersants can inhibit the hydrophobizing effect of the alkoxysilane, the dispersant and the alkoxysilane to use in combination must be selected appropriately.

One specific example of a method for using an alkoxysilane for the hydrophobic treatment is as follows. First, the particles are dispersed in water, and this mixture is mixed with an alkoxysilane-containing aqueous solution (that is, an aqueous solution that contains alkoxysilane hydrolysates), and the resulting mixture is agitated as appropriate in a temperature range of room temperature to 40° C. for a prescribed period of time, preferably 0.5 to 12 hours, to let the mixture react.

Performing the reaction under these conditions allows the reaction to progress suitably, thereby making it possible to obtain a dispersion liquid in which the particles have been sufficiently hydrophobized. If the reaction is allowed to continue for too long, the silanol groups will react with one another and cause the particles to fuse together, thereby reducing the dispersibility of the particles in the dispersion liquid and making the particles more prone to agglomerating into clusters that have two or more layers in the resulting particle monolayer film. Meanwhile, if the reaction is not allowed to continue for long enough, the surfaces of the particles will not be sufficiently hydrophobized, and the resulting particle monolayer film will be more likely to have a wide pitch between particles.

Moreover, non-amine alkoxysilanes undergo hydrolysis under certain acidity or alkalinity conditions, and therefore the pH of the dispersion liquid must be adjusted to be acidic or alkaline during the reaction. The method used to adjust the pH is not limited. However, it is preferable that a method in which an acetic acid aqueous solution is added in a concentration of 0.1 to 2.0 m % relative to the total mass of the dispersion liquid, for example, be used in order to accelerate the hydrolysis and stabilize the silanol groups.

It is preferable that the ratios of the particles to make hydrophobic and the alkoxysilane be set such that the amount of the alkoxysilane is from 1 to 20 times the total mass of the particles to make hydrophobic.

After the prescribed period of time for the reaction, at least one of the abovementioned volatile organic solvents is added to the dispersion liquid, and then the particles that were hydrophobized in water are extracted using an oil phase extraction method. Here, it is preferable that the volume of the organic solvent added be from 0.3 to 3 times the volume of the dispersion liquid before adding the organic solvent. The dispersion liquid obtained from the oil phase extraction method (that is, the dispersion liquid in which the particles are dispersed in the organic solvent) may then be used as-is as the dispersion liquid to be dripped onto the liquid surface of the lower layer water in the dripping step. Furthermore, during this hydrophobic treatment, it is preferable that the mixture be agitated, irradiated with ultrasonic waves, or the like in order to increase the dispersibility of the particles in the dispersion liquid. Increasing the dispersibility of the particles in the dispersion liquid makes it possible to reduce agglomeration of the particles into clusters, thereby making it easier to obtain the particle monolayer film.

Next, a method for reducing particle agglomeration by using ultrasonic irradiation will be described.

It is preferable that the particle monolayer film formation step be performed while applying ultrasonic irradiation. First, applying ultrasonic irradiation from within the lower layer liquid towards the liquid surface thereof during the particle monolayer film formation step reduces particle agglomeration and promotes the closest packing of the particles, thereby making it possible to obtain a particle monolayer film in which the particles are packed with high precision into the closest-packed possible two-dimensional structure.

Here, it is preferable that the ultrasonic output be from 1 to 1200 W and more preferable that the output be from 50 to 600 W.

Moreover, the frequency of the ultrasonic waves is not particularly limited, but it is preferable that the frequency be from 28 kHz to 5 MHz and more preferable that the frequency be from 700 kHz to 2 MHz, for example.

Furthermore, the ultrasonic irradiation may be applied for any period of time as long as that time is sufficient to allow the particles to rearrange. The required time varies depending on parameters such as the particle size, the frequency of the ultrasonic waves, and the solution temperature. However, under normal production conditions, it is preferable that the ultrasonic irradiation be applied for 10 seconds to 60 minutes and more preferable that the ultrasonic irradiation be applied for 3 to 30 minutes.

In general, if the vibration frequency (that is, the frequency of the ultrasonic waves) is too high, the water molecules start to absorb the energy, thereby causing water vapor to rise from the surface of the water or causing water droplets to jump up from the surface of the water. These phenomena are not preferable in the present invention due to the use of the LB technique. Furthermore, if the vibration frequency is too low, the cavitation radius in the lower layer liquid tends to increase, thereby causing bubbles to form in the liquid and rise towards the liquid surface. Formation of such bubbles is not preferable in the present invention because if these bubbles gather beneath the particle monolayer film formed on the liquid surface of the lower layer water, the liquid surface may become uneven and it may no longer be possible to form a suitable particle monolayer film.

Furthermore, applying ultrasonic irradiation may cause standing waves to form in the liquid surface of the lower layer water. Regardless of the frequency used, if the output power is too high or if the wave height in the liquid surface is too high due to the tuning conditions used for the ultrasonic oscillator and the vibration system, the particle monolayer film may be ruptured by the waves in the liquid surface.

For the reasons described above, setting the frequency of the ultrasonic waves appropriately makes it possible to effectively promote formation of a monolayer of the particles without harming the particle monolayer film as it is being formed. However, if the particles are small and have a particle size of less than or equal to 100 nm, for example, the characteristic frequency of the particles tends to be very high, thereby making it more difficult to apply the ultrasonic vibrations in the intended manner as defined by the calculation results.

In this case, performing the calculation on the assumption that characteristic vibration will be applied to groups of two particles, three particles, and so on up to groups with a mass of 20 particles makes it possible to reduce the necessary frequencies to a realistic range. Applying ultrasonic vibration at frequencies that correspond to the characteristic frequencies of groups of particles still makes it possible to promote formation of a monolayer of the particles.

Applying ultrasonic irradiation has other advantages in addition to promoting formation of a monolayer of the particles such as promoting the closest packing of the particles (that is, the closest random hexagonal packing), breaking up the soft clumps of particles that tend to form when preparing the particle dispersion liquid, and repairing point defects, line defects, and crystal dislocations to a certain degree.

As described above, it is preferable that the three types of particles A, B, and C that are arranged randomly to form the particle monolayer film be made from one of the abovementioned materials.

The particle monolayer film is formed by taking advantage of self-assembly of the particles.

The principle behind self-assembly is described below.

Starting from the state in which the particles are floating on the liquid surface and moving randomly relative to one another, surface tension in the dispersion medium between the particles starts taking effect as the particles begin to group together. As a result, the particles automatically form in a close-packed monolayer structure on the liquid surface rather than remaining disordered relative to one another. This formation of a monolayer structure due to surface tension could also be said to be adhesion of the particles to one another due to capillary forces in the horizontal direction.

For example, when three types of particles are floating on the water surface and begin to gather together and contact each other, surface tension acts to minimize the total length of the waterline of each particle group. The particle monolayer film forms as the three types of particles stabilize in an arrangement made of triangles (note that for groups of particles with different particle sizes, these triangles will not be equilateral).

If the waterline falls at the top point of the particle groups (that is, if the particles are submerged beneath the liquid surface) this self-assembly will not take place and the particle monolayer film will not form.

Therefore, it is critical that one of the particles and the lower layer liquid be hydrophobic and the other of the particles and the lower layer liquid be hydrophilic in order to prevent the particle groups from submerging beneath the liquid surface.

Therefore, it is preferable that water be used as the lower layer liquid. Water exhibits a relatively large surface free energy, thereby making it easier to stably maintain the monolayer structure in which the particles are closely packed on the liquid surface once that monolayer structure forms.

Next, the dispersion liquid in which the particles are dispersed (more specifically, the dispersion liquid prepared using one of the abovementioned methods) is dripped onto the liquid surface of the lower layer water in the trough, thereby allowing the dispersion medium (the organic solvent) to spread the particles contained in the dispersion liquid over the liquid surface of the lower layer water. Then, that dispersion medium (the organic solvent) is vaporized to form the particle monolayer film in which the particles are closely packed two-dimensionally.

(Transferring Step)

Next, the transferring step in which the particle monolayer film formed in the particle monolayer film formation step is transferred to the surface of the substrate original plate (that is, the original plate for the organic thin-film solar cell substrate) will be described.

In this transferring step, the particle monolayer film formed on the liquid surface of the lower layer water in the particle monolayer film formation step is transferred as-is in a monolayer state onto the substrate original plate (that is, the organic thin-film solar cell substrate original plate) to be etched.

The specific method by which the particle monolayer film is transferred to the substrate original plate is not particularly limited. One example of a method is lowering a hydrophobic substrate original plate downwards into contact with the particle monolayer film while keeping the substrate original plate substantially parallel thereto in order to transfer the particle monolayer film onto the substrate original plate due to the affinity between the particle monolayer film and the substrate original plate, which are both hydrophobic. Another example of a method is placing the substrate original plate in a substantially parallel orientation in the lower layer water in the trough prior to forming the particle monolayer film and then forming the particle monolayer film and slowly lowering the level of the liquid surface to transfer the particle monolayer film onto the substrate original plate.

In other words, one aspect of the transferring step includes:

lowering a hydrophobic substrate original plate (that is, the original plate for the organic thin-film solar cell substrate) downwards into contact with the particle monolayer film while keeping the substrate original plate substantially parallel thereto; and transferring the particle monolayer film onto the substrate original plate by taking advantage of the affinity between the particle monolayer film and the substrate original plate.

Moreover, another aspect of the transferring step includes:

placing the substrate original plate (that is, the original plate for the organic thin-film solar cell substrate) in a substantially parallel orientation in the lower layer water in the trough prior to forming the particle monolayer film; forming the particle monolayer film on the liquid surface of the lower layer water after the substrate original plate has been placed in the lower layer water; and slowly lowering the level of the liquid surface of the lower layer water after forming the particle monolayer to transfer the particle monolayer film onto the substrate original plate.

These methods make it possible to transfer the particle monolayer film onto the substrate without using special equipment. However, it is preferable that the so-called LB trough method be used in order to make it easier to transfer the particle monolayer film onto the substrate original plate while maintaining the close-packed structure of the particles even when working with particle monolayer films of larger areas.

In the LB trough method used in the method of manufacturing the organic thin-film solar cell according to the embodiment of the present invention, the substrate original plate is immersed in a substantially vertical orientation in the lower layer water in the trough, and then the particle monolayer film formation step is performed to form the particle monolayer film. After the particle monolayer film formation step, the particle monolayer film can be transferred to the substrate original plate by pulling the substrate original plate upwards.

Because the particle monolayer film has already been formed as a monolayer on the liquid surface during the particle monolayer film formation step, the particle monolayer film can be transferred without danger of rupturing and transforming into a multilayer structure or the like even if there are variations in the transfer conditions such as temperature (the temperature of the lower layer water, for example) or the pulling speed used for the substrate original plate.

In other words, one aspect of the method of manufacturing the organic thin-film solar cell according to the embodiment of the present invention includes:

immersing the substrate original plate (that is, the original plate for the organic thin-film solar cell substrate) in a substantially vertical orientation in the lower layer water in the trough;

performing the particle monolayer film formation step while the substrate original plate is immersed in order to form the particle monolayer film;

pulling up the substrate original plate after the particle monolayer film formation step; and transferring the particle monolayer film onto the substrate original plate as the substrate original plate is pulled up.

The temperature of the lower layer liquid depends on the temperature of the environment (which typically varies according to the season or weather) and should be approximately from 10 to 30° C.

Furthermore, using an LB trough equipped with a Wilhelmy surface pressure sensor for measuring the surface pressure of the particle monolayer film and a movable barrier for compressing the particle monolayer film along the liquid surface for the trough makes it possible to transfer larger particle monolayer films to the substrate original plate in a more stable fashion. Using this type of trough makes it possible to compress the particle monolayer film to a preferable diffusion pressure (density) while measuring the surface pressure of the particle monolayer film and also makes it possible to move the particle monolayer film towards the substrate original plate at a constant speed. This allows the transfer of the particle monolayer film from the liquid surface to the substrate original plate to proceed more smoothly and reduces the occurrence of issues such as only being able to transfer small-area particle monolayer films onto the substrate original plate.

It is preferable that the diffusion pressure to which the particle monolayer film is compressed be from 5 to 80 mNm$^{-1}$ and more preferable that the diffusion pressure be from 10 to 40 mNm$^{-1}$. Diffusion pressures in these ranges make it easier to obtain a close-packed particle monolayer film in which there are no gaps between the particles.

Furthermore, it is preferable that the speed at which the substrate original plate is pulled up be from 0.5 to 20 mm/minute.

Using the transferring step described above makes it possible to coat the front surface of the substrate original plate with the particle monolayer film.

After the transferring step, the particle monolayer film may be fixed to the substrate original plate as necessary.

Fixing the particle monolayer film to the substrate original plate makes it possible to reduce the likelihood of particles moving on the substrate original plate during the later dry etching process and also makes it possible to etch the front surface of the substrate original plate more stably and with higher precision.

As the dry etching process proceeds, the particles gradually become smaller in diameter, thereby increasing the likelihood that the particles will move on the substrate original plate.

Examples of fixing methods include using a binder and sintering.

In the method of using a binder, a binder solution is applied to the particle monolayer film side of the substrate original plate after the particle monolayer film has been formed, and then the binder solution permeates through between the particle monolayer film and the substrate original plate.

It is preferable that the amount of binder used be from 0.001 to 0.02 times the total mass of the particle monolayer film.

Using an amount of binder in this range makes it possible to fix the particles sufficiently without having so much binder that the binder gets stuck in the spaces between the particles and negatively affects the etching process. If too much binder solution is applied, the excess binder solution may be removed by using a spin coater or tilting the substrate after allowing the binder solution to permeate through.

Examples of binders that can be used include the alkoxysilanes listed above as hydrophobic agents, general-purpose organic binders, and inorganic binders. After the binder solution is allowed to permeate through, a heat treatment may be applied as appropriate depending on the type of binder used.

When an alkoxysilane is used as the binder, it is preferable that a heat treatment be applied at a temperature of 40 to 80° C. for 3 to 60 minutes.

When using a sintering method, the substrate original plate on which the particle monolayer film is formed may be heated to fuse the particles of the particle monolayer film to the substrate. The heating temperature may be determined according to the materials used for the particles and the substrate. For particles that are less than or equal to 1 µm in average particle size, the sintering should be completed at a relatively low temperature lower than the melting point of the material used for the particles in order to start an interface reaction. If the heating temperature is too high, the fusion area of the particles increases, thereby potentially causing effects that may impact precision such as changes in the shape of the particle monolayer film. Furthermore, if the heating process is performed in air, the substrate and the particles may oxidize, and therefore it is preferable that the heating process be performed in an inert gas atmosphere. When sintering in an atmosphere that contains oxygen, the etching process described below must be performed using conditions that take oxide layers into account.

In other words, one aspect of the fixing step may include:

applying a binder solution to the particle monolayer film side of the substrate original plate (that is, the original plate for the organic thin-film solar cell substrate) on which the particle monolayer film has been formed; and permeating the applied binder solution between the particle monolayer film and the substrate original plate.

Alternatively, one aspect of the fixing step may include sintering the substrate original plate on which the particle monolayer film is formed in order to fuse the particles of the particle monolayer film to the substrate original plate.

(Dry Etching Process)

Dry etching the front surface of the substrate original plate coated with the particle monolayer film as described above makes it possible to obtain the substrate 12 that includes the microstructure 14.

More specifically, when dry etching the front surface of the substrate original plate coated with the particle monolayer film, as the dry etching process begins the etching gas passes through the gaps between the particles of the particle monolayer film and reaches the front surface of the substrate original plate, thereby forming recesses at those positions and forming protrusions at the positions corresponding to where the particles are located. As the dry etching process continues, the particles on top of the protrusions gradually get etched and diminish in size, and at the same time, the recesses etched in the front surface of the substrate original plate become deeper. Ultimately, the substrate 12 is produced with the microstructure 14 formed in the front surface thereof.

In the dry etching process, adjusting the dry etching conditions such as bias power, gas flow rate, and the type and amount of deposition gas used makes it possible to adjust the average height and shape of the protrusions 14a, 14b, and 14c that are formed.

Examples of etching gases for use in the dry etching process include Ar, $SF_6$, $F_2$, $CF_4$, $C_4F_8$, $C_5F_8$, $C_2F_6$, $C_3F_6$, $C_4F_6$, $CHF_3$, $CH_2F_2$, $CH_3F$, $C_3F_8$, $Cl_2$, $CCl_4$, $SiCl_4$, $BCl_2$, $BCl_3$, $BC_2$, $Br_2$, $Br_a$, HBr, $CBrF_3$, HCl, $CH_4$, $NH_3$, $O_2$, $H_2$, $N_2$, CO, and $CO_2$. However, the etching gas is not limited to these examples and any etching gas may be used as long as the effects of the present invention are not negatively affected. At least one of these etching gases may be selected and used according to the materials used for the particles of the particle monolayer film and the substrate.

Furthermore, the dry etching process described above is performed using an etching device. Examples of etching devices that can be used in the method of manufacturing the organic thin-film solar cell according to the embodiment of the present invention include reactive ion etching devices and ion beam etching devices that are capable of anisotropic etching, as well as etching devices that can generate bias electric fields of at least 20 W.

As long as one of these types of etching devices is used, the specifications of the device such as the plasma generation scheme, the electrode configuration, the chamber configuration, and the frequency of the high frequency power supply are not particularly limited.

Furthermore, in the present invention, it is preferable that the etching conditions such as the material used for the particles of the particle monolayer film, the material used for the substrate original plate, the type of etching gas used, the bias power, the antenna power, the gas flow rate and pressure, and the etching time be set such that the resulting etching selectivity (the substrate original plate etching speed and the particle monolayer film etching speed) in the dry etching process is sufficient to achieve the necessary depth for the recess and protrusion microstructure.

Therefore, when colloidal silica particles are selected as the particles for the particle monolayer film etching mask and a quartz substrate is selected, for example, using a gas such as Ar or $CF_4$ for the etching gas makes it possible to achieve a relatively low aspect ratio (such as an aspect ratio of 0.05 to 0.5) during the etching process.

Furthermore, setting the electric field bias power to a value from several dozen to several thousand watts (according to the electrode area of the dry etching device) accelerates the positively charged particles in the plasma-state etching gas and makes those particles enter the substrate at high speed from a substantially vertical direction. Therefore, using a gas that is reactive to the substrate (such as $CF_4$ gas when using a substrate that contains $SiO_2$) makes it possible to increase the reaction speed of the physicochemical etching in the vertical direction.

When using dry etching, depending on the combination of the substrate material and the type of etching gas used, isotropic etching may also occur due to radicals generated from the plasma. This etching due to the radicals is a type of chemical etching in which the target material is etched to the same degree in all directions.

Radicals do not carry an electric charge, and therefore the etching speed of etching caused by the radicals cannot be controlled by setting the bias power. Instead, such etching must be controlled using the concentration of the etching gas in the chamber.

Furthermore, a non-zero gas pressure must be maintained in order to perform anisotropic etching using the charged particles, and therefore the effects of isotropic etching cannot be completely prevented as long as a reactive gas is used.

However, one well-known method of slowing the reaction speed of the radicals is cooling the base material. Many etching devices are equipped with such a feature, and therefore it is preferable that such a device be used when necessary.

Moreover, during the dry etching process, adjusting primarily the bias power and the pressure and using a so-called deposition gas as necessary makes it possible to form a two-dimensional recess and protrusion structure with a relatively low ratio between the height and diameter of the bottom surfaces of the protrusions (that is, the ratio of diameter/height of the bottom surfaces of the protrusions) in the front surface of the substrate original plate.

In the method described above, the recess and protrusion structure is formed in the front surface of the substrate original plate (that is, the original plate for the organic thin-film solar cell substrate) using a dry etching process. However, another example of a method for forming the recess and protrusion structure is using an original plate in which a recess and protrusion structure is formed in the surface thereof as a mold (that is, using an original plate for a mold).

For example, first, an original plate (that is, the original plate for the mold) in the surface of which is formed a recess and protrusion structure that includes a plurality of protrusions of different diameters such as protrusions 14a, 14b, and 14c that are arranged two-dimensionally at random is produced. Then, the original plate for the mold in the surface of which is formed the recess and protrusion structure is used as a mold to produce the substrate 12.

The recess and protrusion structure formed in the surface of the original plate for the mold is transferred to the front surface of the substrate original plate (that is, the original plate for the organic thin-film solar cell) an even number of times, thereby forming in the front surface of the substrate original plate a recess and protrusion structure that includes the plurality of protrusions 14a, 14b, and 14c of different diameters that are arranged two-dimensionally at random. This substrate original plate is then used as the substrate that has the recess and protrusion structure.

If the recess and protrusion structure formed in the surface of the original plate for the mold is transferred to the substrate original plate an odd number of times, a substrate that has a recess and protrusion structure that includes a plurality of recesses of different diameters arranged two-dimensionally at random in the front surface of the substrate original plate is obtained. The recess and protrusion structure in the front surface of the substrate is inverted relative to the recess and protrusion structure in the surface of the original plate for the mold.

However, the shape of the recess and protrusion structure becomes more blunt as the number of times the structure is transferred increases, and therefore it is preferable that the actual number of transfers be limited to one to four times.

If the recess and protrusion structure formed in the surface of the original plate for the mold is transferred to the substrate original plate an even number of times, a substrate that has a recess and protrusion structure that includes a plurality of protrusions of different diameters arranged two-dimensionally at random in the front surface of the substrate original plate is obtained. In this case, the recess and protrusion structure in the front surface of the substrate has the same shape as the recess and protrusion structure in the surface of the original plate for the mold.

However, the shape of the recess and protrusion structure becomes more blunt as the number of times the structure is transferred increases, and therefore it is preferable that the actual number of transfers be limited to one to four times.

This method of transferring the structure formed in the surface of the original plate for the mold is a well-known technology and can be performed using one of the methods disclosed in Japanese Unexamined Patent Application Publication No. 2009-158478A, for example, such as nanoimprinting, hot pressing, injection molding, or UV embossing.

In other words, one aspect of the method of manufacturing an organic thin-film solar cell according to the embodiment of the present invention is a method of manufacturing an organic thin-film solar cell that includes an organic thin-film solar cell substrate and an anode, an organic thin-film layer including an organic semiconductor layer, and a cathode layered in order on top of the substrate, the method including:

forming a particle monolayer film that includes a mixture of particles of different average particle sizes on a surface of an original plate for a mold;

dry etching using the particle monolayer film as an etching mask to form a microstructure that includes a plurality of recesses or protrusions arranged two-dimensionally at random on the surface of the original plate for the mold;

transferring the microstructure formed in the surface of the original plate for the mold to at least one surface of the organic thin-film solar cell substrate; and layering at least the anode, the organic thin-film layer, and the cathode on top of the organic thin-film solar cell substrate such that a shape of the microstructure is duplicated in interfaces between the anode, the organic thin-film layer, and the cathode.

Furthermore, it is preferable that the step of transferring the microstructure formed in the surface of the original plate for the mold to at least one surface of the organic thin-film solar cell substrate be performed using nanoimprinting, hot pressing, injection molding, or UV embossing.

In this method of manufacturing an organic thin-film solar cell, it is preferable that the recess and protrusion-shaped microstructure be formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the cathode and the organic semiconductor layer, and when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer, the power spectrum of the height distribution of the microstructure exhibits determinate values between the upper wavenumber limit $K_1$ and the lower wavenumber limit $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution over all wavenumbers.

(Layering Step)

Next, a process for layering the layers of the organic thin-film solar cell 10 in the method of manufacturing the organic thin-film solar cell according to the embodiment of the present invention will be described.

The organic thin-film solar cell 10 according to the embodiment of the present invention can be obtained by layering the anode 16, the hole extraction layer 18, the electron blocking layer 20, the organic semiconductor layer 22, the electron extraction layer 24, and the cathode 26 in order on top of the front surface of the substrate 12 in which the microstructure 14 (the recess and protrusion structure formed as described above) is formed.

The layering method is not particularly limited, and any well-known technology used in manufacture of conventional organic thin-film solar cells may be used.

For example, the anode 16 and the cathode 26 may be formed using a method such as sputtering or vacuum deposition.

As described above, in the organic thin-film solar cell 10 according to the embodiment of the present invention, the microstructure 14 is formed in the front surface of the substrate 12 and is a recess and protrusion microstructure that includes the plurality of protrusions 14a, 14b, and 14c. The anode 16, the hole extraction layer 18, the electron blocking layer 20, the organic semiconductor layer 22 that includes the electron-donating layer 22a and the electron-accepting layer 22b, the electron extraction layer 24, and the cathode 26 are layered in order on top of the substrate 12, and current generated when light enters from the substrate 12 side flows through the cathode 26 to an external current.

Furthermore, in an organic thin-film solar cell manufactured using the method of manufacturing an organic thin-film solar cell according to the embodiment of the present invention, the microstructure 14 formed in the front surface of the substrate 12 is formed as a random two-dimensional recess and protrusion structure by performing a dry etching process in which a particle monolayer film made from a mixture of particles of different average particle sizes is used as an etching film. This structure causes surface plasmons to be excited, thereby stably improving the photovoltaic energy conversion efficiency of the cell.

(Evaluation Method)

Figure 6A:
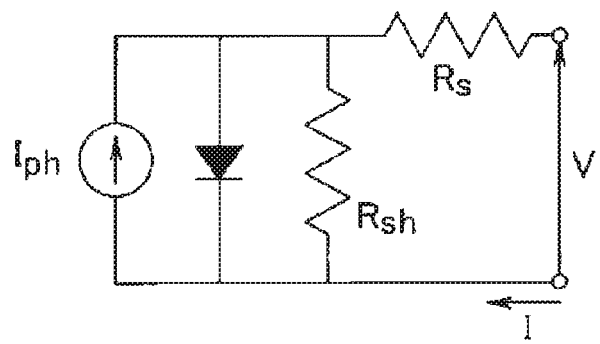
FIG. 6A illustrates an equivalent circuit of a typical solar cell.
Figure 6B:
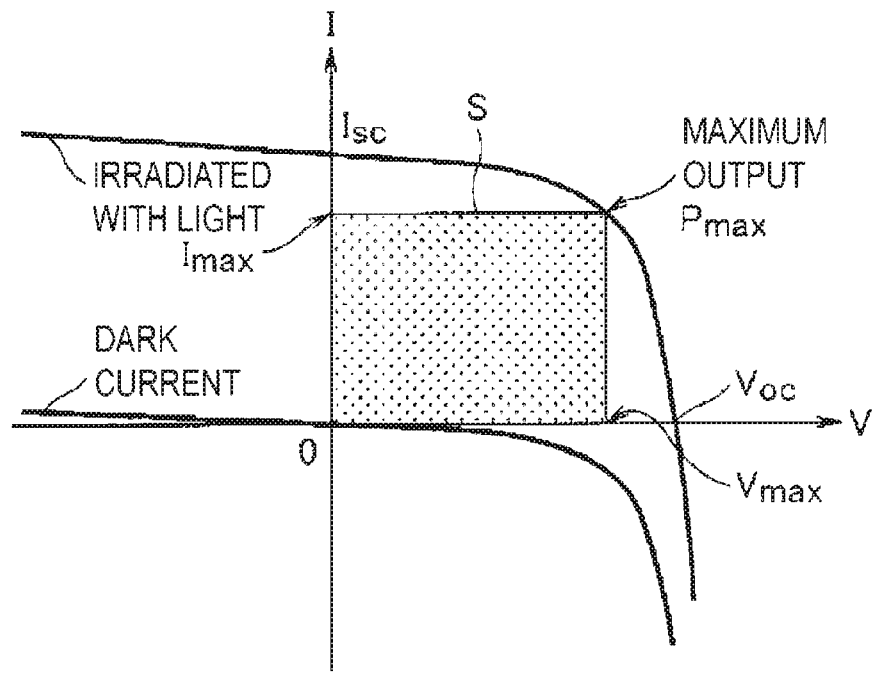
FIG. 6B is a graph showing the current-voltage characteristics of the solar cell.

Next, the voltage-current characteristics of a solar cell will be described. FIG. 6A illustrates an equivalent circuit of a solar cell. FIG. 6B is a graph showing the current-voltage characteristics of the solar cell.

The equivalent circuit illustrated in FIG. 6A models an actual solar cell device. However, to use an even simpler model, the resistance components in the circuit diagram in FIG. 6A may be omitted.

More specifically, the resistance components $R_s$ and $R_{sh}$ illustrated in FIG. 6A may be ignored, and a circuit that includes only the current source $I_{ph}$ and the diode (which is assumed to not be an ideal diode) may be used.

The voltage-current characteristics of the dark current of such a simplest-case solar cell model in which the resistors are ignored is given below by equation (2).

<Equation 2>

$$I = -I_0 \{\exp(qV/nkT) - 1\} \quad (2)$$

In equation (2), $I_0$ is the reverse saturation current, q is the elementary charge, V is voltage, n is the ideality factor of the diode, k is the Boltzmann constant, and T is temperature.

For the simple solar cell model described above, n can be set to 1 in equation (2), which then gives the ideal current-voltage characteristics at the p-n junction of the solar cell.

Next, to model the actual solar cell device, the series resistance $R_s$ and the shunt resistance $R_{sh}$ components must also be considered in addition to equation (2).

The series resistance component corresponds to the resistance to current of all of the components of the device, and the lower this value, the better the performance. Meanwhile, the shunt resistance component arises due to leakage currents or the like near the p-n junction, and the higher this value, the better the performance.

Equation (3) takes both equation (2) and the resistance components into account and gives the current-voltage characteristics for an actual device irradiated with light.

<Equation 3>

$$I=I_{ph}-I_0[\exp\{q(V+R_sI)/nkT\}-1]-(V+R_sI)/R_{sh} \quad (3)$$

FIG. 6B is a graph showing the current-voltage characteristics of the solar cell when irradiated with light as given by equation (3).

The current-voltage characteristics shown in FIG. 6B are based on the values obtained from irradiating an actual organic thin-film solar cell 10 of the present invention with artificial sunlight.

Next, a method for calculating the nominal conversion efficiency $\eta_n$ of a solar cell will be described with reference to FIG. 6B.

In the present embodiment, the nominal conversion efficiency $\eta_n$ of the solar cell is calculated using equation (4).

In equation (4) which gives the calculation for the nominal conversion efficiency $\eta_n$, the input energy of the incident light is normalized to 100 mW/cm² (1000 W/m²).

<Equation 4>

$$n_n=V_{oc} \cdot J_{sc} \cdot FF \quad (4)$$

In equation (4), $V_{oc}$ is the open-circuit voltage. When the cell is irradiated with light, the current that flows to outside of the cell is 0 A. In other words, this corresponds to the output voltage when the terminals of the circuit are left open.

In FIG. 6B, the open-circuit voltage $V_{OC}$ is the point where the current-voltage characteristics curve corresponding to when the cell is irradiated with light intersects with the horizontal axis.

Furthermore, in equation (4), $J_{SC}$ is the short-circuit current density and can be obtained from equation (5) as given below.

<Equation 5>

$$J_{sc}=I_{sc}/s \quad (5)$$

In equation (5), $I_{sc}$ is the short-circuit current. When the cell is irradiated with light, the voltage applied to outside of the cell is 0 V. In other words, this corresponds to the current produced when the cell is short-circuited.

In FIG. 6B, the short-circuit current $I_{sc}$ is the point where the current-voltage characteristics curve corresponding to when the cell is irradiated with light intersects with the vertical axis.

Furthermore, in equation (5), S is the effective light-receiving area. The output P of the solar cell is the product of the voltage V and the current I. The maximum output $P_{max}$ shown on the voltage-current characteristics curve corresponding to when the cell is irradiated with light in FIG. 6B is the product of the maximum voltage $V_{max}$ and the maximum current $I_{max}$.

Furthermore, in equation (4), FF is the fill factor and can be calculated using the maximum output voltage $V_{max}$, the maximum output current $I_{max}$, the open-circuit voltage $V_{OC}$, and the short-circuit current $I_{SC}$, as shown below in equation (6).

<Equation 6>

$$FF=(V_{max} \cdot I_{max})/(V_{oc} \cdot I_{sc}) \quad (6)$$

The nominal conversion efficiency $\eta_n$ can then be calculated by plugging the open-circuit voltage $V_{OC}$, the open-circuit voltage $I_{SC}$ and the fill factor FF into equation (4).

This calculation method makes it possible to evaluate the organic thin-film solar cell 10 according to the embodiment of the present invention. Therefore, in the following experimental examples, the organic thin-film solar cell 10 according to the embodiment of the present invention can be irradiated with artificial sunlight in a solar simulator and evaluated using the evaluation method described above.

Moreover, in the present embodiment, when the organic thin-film solar cell 10 is produced using the etching method that employs the particle monolayer film, the average particle sizes of the particles used to form the particle monolayer film are calculated using the method described above.

This makes it possible to form the microstructure 14 (the recess and protrusion structure that includes the plurality of protrusions 14a, 14b, and 14c) in the front surface of the substrate 12 such that the surface plasmon mode is efficiently excited by light in the absorption band of the organic semiconductor in the organic thin-film solar cell 10 according to the embodiment of the present invention.

Furthermore, in another aspect of the method of manufacturing the organic thin-film solar cell 10 according to the embodiment of the present invention, the method for measuring the recess and protrusion structure described above may be used to select an organic thin-film solar cell substrate that has a recess and protrusion structure that exhibits the characteristics of the present invention from among several organic thin-film solar cell substrates manufactured using the method described above.

Therefore, in the organic thin-film solar cell 10 according to the embodiment of the present invention, surface plasmons are efficiently excited by light in the absorption band of the organic semiconductor and light energy is efficiently absorbed by the organic semiconductor, thereby making it possible to improve photovoltaic energy conversion efficiency in comparison with conventional organic thin-film solar cells.

Other Embodiments

The embodiment described above may be modified as described below in (1) to (5).

(1) In another aspect of the organic thin-film solar cell 10 according to the embodiment of the present invention, the protrusions 14a, 14b, 14c, and the like in the recess and protrusion structure may be column-shaped, cone-shape, truncated cone-shaped, or sine wave-shaped or may have shapes derived from these base shapes, for example.

(2) In another aspect of the organic thin-film solar cell 10 according to the embodiment of the present invention, the particles used to produce the recess and protrusion structure on the front surface of the substrate 12 are not limited to mixtures of three types of particles of different average particle sizes, and a mixture of two to 20 types of particles of different average particle sizes may be used.

Furthermore, when using a mixture of a large number of types of particles of different average particle sizes, it is preferable that the coefficient of variation of these average particle sizes be greater than or equal to 0% and less than or equal to 20% and more preferable that the coefficient of variation be greater than or equal to 0% and less than or equal to 10%.

Here, "coefficient of variation of the average particle sizes" refers to the standard deviation of the particle sizes divided by the average particle size, which is typically calculated using statistical methods and can be obtained from the peak observed when the particle size distribution as measured with dynamic light scattering using a particle characteristic evaluation device such as a Malvern Instruments Ltd. Zetasizer Nano-ZS is fit to a Gaussian curve.

Furthermore, a single type of particles of a single average particle size can be used to achieve the main effects of the present invention as long as those particles exhibit a wide particle size distribution.

When using a single type of particles of a single average particle size, a suitable particle mask can be obtained when the coefficient of variation of the average particle size is from 20 to 160%.

The main effects of the present invention can also be achieved using a particle mask made from a combination of particles with a coefficient of variation of less than or equal to 20% in average particle size and particles with a coefficient of variation of 20 to 160% in average particle size.

(3) In the embodiment described above, the microstructure 14, the anode 16, the organic semiconductor layer 22, and the cathode 26 are layered in order on top of the substrate 12. However, the present invention is not limited to this layering order, and in another aspect of the organic thin-film solar cell 10 according to the embodiment of the present invention, the layering order may be reversed.

(4) In the embodiment described above, an example in which the cathode 26 includes only a metal layer was described. However, in another aspect of the organic thin-film solar cell 10 according to the embodiment of the present invention, the cathode 26 may have a multilayer structure in which a plurality of layers are layered together.

When the cathode 26 is a multilayer cathode conductive layer, any configuration may be used as long as at least one metal layer is included. The layers other than this metal layer may also be made from a metal material or may be made from a conductive material other than a metal.

Examples of conductive materials other than metals include the examples of materials listed for the anode 16 such as ITO, IZO, ZnO, and ZTO.

(5) In the embodiment described above, the microstructure 14 is formed on top of the substrate 12. However, the present invention is not limited to this configuration, and in another aspect of the method of manufacturing the organic thin-film solar cell 10 according to the embodiment of the present invention, a manufacturing method that employs the following nanoimprinting method may be used.

Next, this alternative aspect of the method of manufacturing the organic thin-film solar cell 10 according to the embodiment of the present invention will be described.

In one example of the present manufacturing method, a recess and protrusion structure does not have to be formed in the front surface of the substrate (that is, the organic thin-film solar cell substrate).

However, a recess and protrusion structure may still be formed in the front surface of the substrate in order to increase the light extraction efficiency or for another reason.

First, the anode is formed as a film on the front surface of the substrate, and the organic thin-film layer (which includes at least one layer selected from a group consisting of the organic semiconductor layer, the hole extraction layer, the electron blocking layer, and the electron extraction layer) is layered on top of the anode. The method for layering each layer is not particularly limited, and any well-known technology used in manufacture of conventional organic thin-film solar cells may be used.

Furthermore, the anode may be formed using a vacuum film formation method such as sputtering or vacuum deposition.

Moreover, one or all of the layers of the organic thin-film layer may be formed using a coating method such as spin coating, inkjetting, or slit coating. In addition, examples of methods other than coating methods that can be used to form the organic thin-film layer include vacuum film formation methods such as vacuum deposition, for example.

In one example of the present manufacturing method, nanoimprinting is used to form a recess and protrusion structure on the front surface of an organic thin-film layer formed using a coating method. Furthermore, when the layer of the organic thin-film layer in the front surface of which is formed the recess and protrusion structure is one of the layers other than the electron extraction layer, the remaining layers of the organic thin-film layer are formed as films using a coating method or a vacuum film formation method.

When forming the remaining layers of the organic thin-film layer as films on top of the layer in which the recess and protrusion structure was nanoimprinted (that is, the remaining layers of the organic thin-film layer in which the recess and protrusion structure is not nanoimprinted), care must be taken not to inadvertently planarize the recess and protrusion structure formed using nanoimprinting.

More specifically, when a coating method is used as the film formation method to form the remaining layers of the organic thin-film layer, diluting the concentration of the coating solution is effective in making sure that the nanoimprinted recess and protrusion structure is not inadvertently filled in. When a vacuum film formation method is used as the film formation method to form the remaining layers of the organic thin-film layer, using a strong vacuum, maintaining a large distance between the substance and the deposition source, and making sure that the deposition material is directed as orthogonally as possible towards the surface in which the recess and protrusion structure is formed are effective. Film formation methods that do not cause planarization of the nanoimprinted recess and protrusion structure are not limited to these methods, however.

Next, examples of methods in which nanoimprinting is used to form a recess and protrusion structure in the front surface of the organic thin-film layer as formed using a coating method will be described.

(a) An organic thin-film layer that contains a thermoplastic material is layered together using a film formation method that includes coating. A recess and protrusion-shaped mold is then pressed into the front surface of the organic thin-film layer while applying heat (or after applying heat), thereby transferring the recess and protrusion shape of the mold to the front surface of the organic thin-film layer.

(b) An organic thin-film layer that contains a thermosetting resin is layered together using a film formation method that includes coating. A recess and protrusion-shaped mold is then pressed into the front surface of the organic thin-film layer for a prescribed period of time while applying heat. Then, the mold is separated from the front surface of the organic thin-film layer, thereby completing transfer of the recess and protrusion shape of the mold to the front surface of the organic thin-film layer.

(c) An organic thin-film layer that contains a UV-curing resin is layered together using a film formation method that includes coating. A recess and protrusion-shaped mold is then pressed into the front surface of the organic thin-film layer for a prescribed period of time while applying UV radiation (or after applying UV radiation). Then, the mold is separated from the front surface of the organic thin-film layer, thereby completing transfer of the recess and protrusion shape of the mold to the front surface of the organic thin-film layer.

The mold used in the manufacturing methods (a) to (c) for the organic thin-film solar cell may be an original plate in which a recess and protrusion structure that includes a plurality of recesses or protrusions arranged two-dimensionally at random is formed by using a dry etching process in which a particle monolayer film made from a mixture of a plurality of types of particles of different average particle sizes is used as an etching mask. Alternatively, the mold may be a transfer member produced from the original plate using a method such as electroforming, nanoimprinting, injection molding, or UV embossing.

When using a transfer member as the mold, in some cases the recess and protrusion structure may be inverted relative to the recess and protrusion structure of the original plate.

In the methods described above, layering at least the cathode on top of the organic thin-film layer makes it possible to manufacture an organic thin-film solar cell in which the recess and protrusion structure is formed in the interface between the organic thin-film layer and the cathode.

In a method of manufacturing an organic thin-film solar cell in which the recess and protrusion structure is formed on top of the substrate and then at least the anode, the organic thin-film layer that includes the organic semiconductor layer, and the cathode are layered on top of the substrate to duplicate the recess and protrusion structure in the interfaces between each layer, if at least one of the layers of the organic thin-film layer was formed using a coating method, the recess and protrusion structure may be inadvertently planarized and may not be sufficiently duplicated in the interface between the cathode and organic thin-film layer that includes the organic semiconductor layer.

In this case, it is preferable that the recess and protrusion structure be formed on the front surface of the organic thin-film layer using the nanoimprinting method described above.

Another aspect of the method of manufacturing an organic thin-film solar cell according to the embodiment of the present invention is a method of manufacturing an organic thin-film solar cell that includes an organic thin-film solar cell substrate and an anode, an organic thin-film layer including an organic semiconductor layer, and a cathode layered in order on top of the substrate, the method comprising:

forming a particle monolayer film that includes a mixture of particles of different average particle sizes on a surface of an original plate for a mold;

dry etching using the particle monolayer film as an etching mask to form a recess and protrusion-shaped microstructure that includes a plurality of recesses or protrusions arranged two-dimensionally at random on the surface of the original plate for the mold in order to produce a mold;

producing, as needed, a transfer member in which the recess and protrusion-shaped microstructure is inverted;

layering at least the anode and the organic thin-film layer on top of the organic thin-film solar cell substrate;

transferring the microstructure of the mold or the inverted microstructure of the transfer member to a surface of the organic thin-film layer by pressing the mold or the transfer member thereon; and layering the cathode on top of the organic thin-film layer in order to form the microstructure or the inverted microstructure in an interface between the organic thin-film layer and the cathode.

In this method of manufacturing an organic thin-film solar cell, it is preferable that the recess and protrusion-shaped microstructure be formed such that, when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the cathode and the organic semiconductor layer, and when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer, the power spectrum of the height distribution of the microstructure exhibits determinate values between the upper wavenumber limit $K_1$ and the lower wavenumber limit $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution over all wavenumbers.

Furthermore, it is preferable that the step of transferring the microstructure to the surface of the thin-film layer include using nanoimprinting to form the recess and protrusion structure in the surface of the organic thin-film layer formed using a coating method.

For example, in the step of transferring the microstructure to the surface of the thin-film layer:

the organic semiconductor layer may contain a thermoplastic material layered using a film formation method that includes coating, and a recess and protrusion-shaped mold may be pressed into the front surface of the layered organic semiconductor layer while applying heat (or after applying heat), thereby transferring the recess and protrusion shape of the mold to the front surface of the organic thin-film layer.

Alternatively, the organic semiconductor layer may contain a thermosetting resin layered using a film formation method that includes coating, and a recess and protrusion-shaped mold may be pressed into the front surface of the layered organic thin-film layer for a prescribed period of time while applying heat, and then the mold may be separated from the front surface of the organic thin-film layer, thereby completing transfer of the recess and protrusion shape of the mold to the front surface of the organic thin-film layer.

Alternatively, the organic semiconductor layer may contain a UV-curing resin layered using a film formation method that includes coating, and a recess and protrusion-shaped mold may be pressed into the front surface of the layered organic thin-film layer for a prescribed period of time while applying UV radiation (or after applying UV radiation), and then the mold may be separated from the front surface of the organic thin-film layer, thereby completing transfer of the recess and protrusion shape of the mold to the front surface of the organic thin-film layer.

Furthermore, the mold used in the method of manufacturing the organic thin-film solar cell may be an original plate in which a recess and protrusion structure that includes a plurality of recesses or protrusions arranged two-dimensionally at random is formed by using a dry etching process in which a particle monolayer film made from a mixture of a plurality of types of particles of different average particle sizes is used as an etching mask. Alternatively, the mold may be a transfer member produced from the original plate using a method such as electroforming, nanoimprinting, injection molding, or UV embossing.

When using a transfer member as the mold, the recess and protrusion structure of the transfer member may be inverted relative to the recess and protrusion structure of the original plate.

(6) In another aspect of the organic thin-film solar cell 10 according to the embodiment of the present invention, aspects of the embodiment described above and aspects of the modification examples (1) to (5) as described above may be combined as appropriate.

INDUSTRIAL APPLICABILITY

The present invention is suitable for application to manufacture of organic thin-film solar cells for use in a wide variety of environments and therefore exhibits exceptional industrial applicability.

REFERENCE SIGNS LIST

10 Organic thin-film solar cell
12 Transparent substrate
14 Microstructure
16 Anode
18 Hole extraction layer
20 Electron blocking layer
22 Organic semiconductor layer
22a Electron-donating organic semiconductor layer
22b Electron-accepting organic semiconductor layer
24 Electron extraction layer
26 Cathode

What is claimed is:

1. An organic thin-film solar cell, comprising:
a substrate;
an anode;
an organic thin-film layer that includes an organic semiconductor layer and an electron extraction layer formed on top of an electron-accepting organic semiconductor layer; and
a cathode,
the anode, the organic thin-film layer that includes the organic semiconductor layer and the electron extraction layer, and the cathode being layered on top of the substrate,
the organic semiconductor layer including an electron-donating organic semiconductor layer and the electron-accepting organic semiconductor layer formed on top of the electron-donating organic semiconductor layer,
a recess and protrusion-shaped microstructure that includes a plurality of recesses and protrusions arranged two-dimensionally at random being formed in an interface between the organic thin-film layer and the cathode, wherein the distance between a first interface that is the interface between the electron-donating organic semiconductor layer and the electron-accepting organic semiconductor layer and a second interface that is the interface between the organic thin-film layer and the cathode is 5.5 nm to 200 nm, and
the recess and protrusion-shaped microstructure being formed such that,
when $\lambda_1$ and $\lambda_2$ are a shorter wavelength and a longer wavelength, respectively, of wavelengths that produce an absorption edge in a light absorption spectrum of the organic semiconductor layer, and $k_1$ and $k_2$ are real parts of propagation constants of surface plasmons that correspond, respectively, to those wavelengths and occur along an interface between the organic semiconductor layer and the cathode, and
when the real part $k_1$ corresponds to an upper wavenumber limit $K_1$ in a power spectrum of a height distribution of the microstructure formed in the interface between the cathode and the organic semiconductor layer, and the real part $k_2$ corresponds to a lower wavenumber limit $K_2$ in the power spectrum of the height distribution of the microstructure formed in the interface between the cathode and the organic semiconductor layer,
the power spectrum of the height distribution of the microstructure exhibits determinate values between the upper wavenumber limit $K_1$ and the lower wavenumber limit $K_2$, and an integrated value of a spectral intensity of the power spectrum of the height distribution over a wavenumber range from $K_1$ to $K_2$ is equal to at least 50% of an integrated value of the spectral intensity of the power spectrum of the height distribution over all wavenumbers.

2. The organic thin-film solar cell according to claim 1, wherein an average depth of the recesses and an average height of the protrusions of the microstructure is from 15 to 180 nm.

3. The organic thin-film solar cell according to claim 1, wherein the recess and protrusion-shaped microstructure being formed in a surface of the substrate, and the recess and protrusion-shaped microstructure being duplicated at interfaces between the anode, the organic thin-film layer, and the cathode.

4. The organic thin-film solar cell according to claim 3, wherein an average depth of the recesses and an average height of the protrusions of the microstructure is from 15 to 180 nm.

5. The organic thin-film solar cell according to claim 1, wherein
the distance between the first interface and the second interface is a sum of the thickness of the electron-accepting organic semiconductor layer and the electron extraction layer, and
the thickness of the electron-accepting organic semiconductor layer being from 5 nm to 150 nm and the thickness of the electron extraction layer being 0.5 nm to 50 nm.

* * * * *